(12) United States Patent
Buckalew et al.

(10) Patent No.: US 7,727,863 B1
(45) Date of Patent: Jun. 1, 2010

(54) SONIC IRRADIATION DURING WAFER IMMERSION

(75) Inventors: Bryan L. Buckalew, Tualatin, OR (US); Jonathan D. Reid, Sherwood, OR (US); Johanes H. Sukamto, Lake Oswego, OR (US); Frederick Dean Wilmot, Gladstone, OR (US); Richard S. Hill, Atherton, CA (US)

(73) Assignee: Novellus Systems, Inc., San Jose, CA (US)

( * ) Notice: Subject to any disclaimer, the term of this patent is extended or adjusted under 35 U.S.C. 154(b) by 4 days.

(21) Appl. No.: 12/286,243

(22) Filed: Sep. 29, 2008

(51) Int. Cl.
*H01L 21/322* (2006.01)

(52) U.S. Cl. .................. 438/473; 438/478; 438/795; 257/E21.17; 257/E21.174; 257/E21.304; 257/E21.329; 257/E21.333; 257/E21.475; 257/428; 257/414

(58) Field of Classification Search .............. 438/473, 438/478, 535, 513, 441, 680, 692, 678, 687, 438/795; 257/414, 428, E21.17, 174, 304, 257/329, 333, 475
See application file for complete search history.

(56) References Cited

U.S. PATENT DOCUMENTS

| | | | |
|---|---|---|---|
| 4,205,966 A | 6/1980 | Horikawa | |
| 5,037,481 A | 8/1991 | Bran | |
| 5,427,622 A | 6/1995 | Stanasolovich | |
| 5,653,860 A * | 8/1997 | Nicholls et al. | ............... 205/80 |
| 6,224,713 B1 | 5/2001 | Hembree et al. | |
| 6,244,280 B1 | 6/2001 | Dryer et al. | |
| 6,428,661 B1 | 8/2002 | Hongo | |
| 6,551,487 B1 * | 4/2003 | Reid et al. | .................. 205/137 |
| 6,626,196 B2 | 9/2003 | Downes, Jr. et al. | |
| 6,774,056 B2 | 8/2004 | Kuntz et al. | |
| 6,797,135 B2 | 9/2004 | Kim et al. | |
| 7,267,727 B2 | 9/2007 | McDermott et al. | |
| 2008/0149489 A1 | 6/2008 | Varadarajan et al. | |

* cited by examiner

*Primary Examiner*—David Nhu
(74) *Attorney, Agent, or Firm*—Weaver Austin Villeneuve & Sampson LLP

(57) ABSTRACT

Sonic radiation is applied to a wafer portion of the planar surface of a rotating, tilted wafer as it is being immersed into a liquid treatment bath. The portion includes the leading outer edge region of the wafer. The area of the wafer portion is significantly less than the total surface area of the planar wafer surface. Power density is minimized. As a result, bubbles are removed from the wafer surface and cavitation in the liquid bath is avoided. In some embodiments, the liquid bath is de-gassed to inhibit bubble formation.

25 Claims, 16 Drawing Sheets

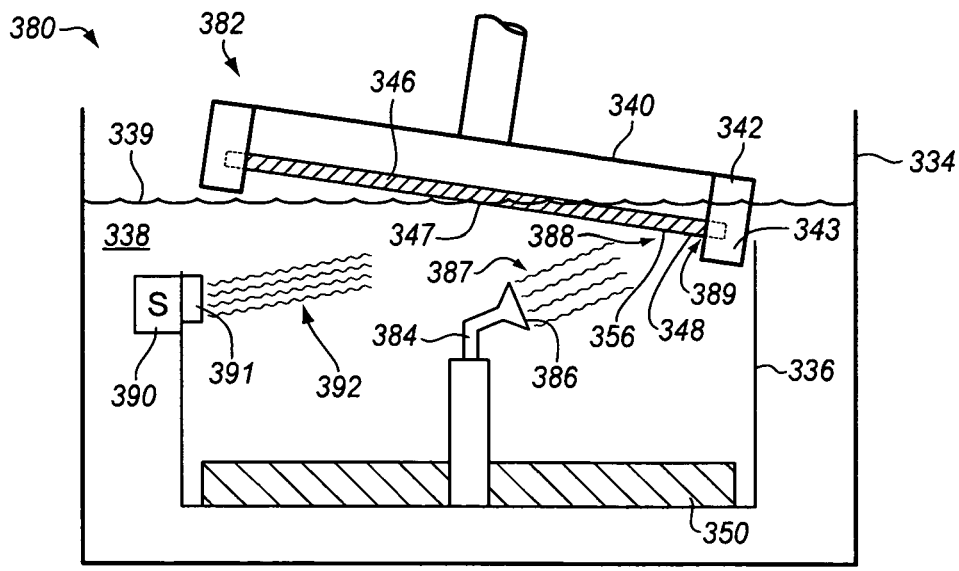
FIG. 15
FIG. 16
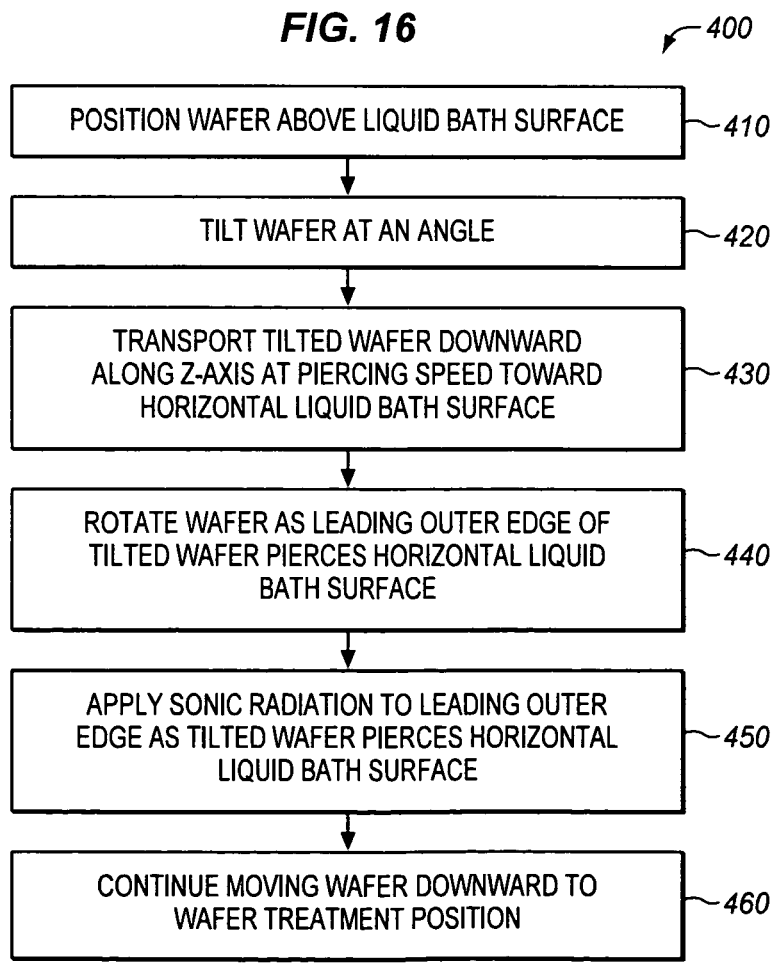

SONIC IRRADIATION DURING WAFER IMMERSION

FIELD OF THE INVENTION

The present invention pertains to the field of integrated circuit fabrication, particularly to systems and methods for immersing a substrate wafer into a liquid processing bath to reduce bubble formation on the substrate surface.

BACKGROUND OF THE INVENTION

Integrated circuits are formed on wafers by well-known processes and materials. These processes typically include the deposition of thin film layers by sputtering, metal-organic decomposition, chemical vapor deposition, plasma vapor deposition, and other techniques. These layers are processed by a variety of well-known etching technologies and subsequent deposition steps to provide a completed integrated circuit.

A crucial component of integrated circuits is the wiring or metallization layer that interconnects the individual circuits. Conventional metal deposition techniques include physical vapor deposition (e.g., sputtering and evaporation) and chemical vapor deposition techniques. Integrated circuit manufacturers have also developed electrolytic and electroless plating techniques to deposit primary conductor films on semiconductor substrates.

Wiring layers traditionally contained aluminum and a plurality of other metal layers that are compatible with aluminum. In 1997, IBM introduced technology that facilitated a transition from aluminum to copper wiring layers. This technology demanded corresponding changes in process architecture towards damascene and dual damascene architecture, as well as new process technologies.

Copper damascene and dual damascene circuits are produced by initially forming trenches and other embedded features in a wafer, as needed for circuit architecture. These trenches and embedded features are formed by conventional photolithographic processes in a nonconductive substrate, such as a silicon oxide. A barrier layer, for example, of silicon nitride or tantalum, is deposited next. An initial seed or strike layer, (e.g., a copper or ruthenium layer having a thickness of about 5 nanometers (nm) to 200 nm) is then deposited by a conventional physical or vapor deposition technique. The seed layer is used as a base layer to conduct current for electroplating thicker films. Thinner seed layers are preferred to reduce overhang and closure of very small features by metal from the seed layer. The seed layer functions as the initial cathode of an electroplating cell. Electrical contacts to the wafer are normally made at its edge.

Generally, in electroplating processes, the thickness profile of the deposited metal is controlled to be as uniform as possible. This uniform profile is advantageous in subsequent etchback or polish removal steps, as well as in uniform void-free filling of the trench structures. Prior art electroplating techniques are susceptible to thickness irregularities. Factors contributing to these irregularities include the size and shape of the electroplating cell, electrolyte depletion effects, hot edge effects, and the terminal effect.

The introduction of damascene metallization for copper interconnects led to the development and modification of processes. The implementation of new process flows resulted in the formation of device-killing defects, as well as nuisance defects, which interfere with the ability to identify accurately the device-killing defects. In copper damascene metallization, defects generally arise during the three main process sequences: deposition of barrier and seed layers; electrofill operations, including pre- and post-anneal; and chemical mechanical polishing (CMP). Critical post-plating in-film killer defects in electroplated copper layers include pits, craters, and voids, which typically form during the electroplating process or during the post-plate anneal steps. Another type of defects include protrusions, surface debris and embedded particles.

Electroless plating (or electroless deposition) of copper and other metals has received increasing interest in recent years. This interest is due in part because of the relatively low cost of electroless processes compared to other (e.g., vacuum) deposition techniques, and because of generally surface-controlled, selective, conformal deposition of electroless processes. Electroless deposition has a number of potential applications, such as repair of marginal seed layers for copper damascene electroplating, creation of seed layers and barrier layers directly on dielectric material, and selective deposition of barrier and electromigration capping layers onto damascene metal (e.g., cobalt and cobalt alloys on copper). Conventional electroless metal deposition is conducted in a system containing one or multiple open baths containing plating solution. In a typical operation, a wafer holder immerses a substrate wafer face down in the plating solution during plating operations.

Wafer immersion into an electroless or electrolytic plating bath generally comprises no more than five hundred milliseconds of a plating process, which typically lasts a few tens of seconds up to a few minutes. Yet, the defects formed as a result of entry conditions often critically affect yield (the number of chips that function in a full wafer). One of the reasons defects form as a result of wafer immersion into a plating bath is because of air trapped during entry. Air bubbles trapped on the plating surface of a wafer cause numerous problems. Bubbles shield a region of the plating surface of a wafer from exposure to electrolyte, and thus produce a region where plating does not occur. The resulting plating defect can manifest itself as a region of no plating or of reduced thickness, depending on the time at which the bubble became entrapped on the wafer and the length of time that it stayed entrapped there. In an inverted (face down) configuration, buoyancy forces tend to pull bubbles upwards and onto the wafer's active planar surface. Bubbles are difficult to remove from the wafer surface because the plating cell has no intrinsic mechanism for driving the bubbles around the wafer edges, the only path off the wafer surface. For example, FIG. 1 depicts schematically a representative plating system 102 of the prior art in which bubbles 104 and air 105 are trapped on wafer surface 106 of a semiconductor wafer 108 after its immersion into a plating bath 110. Typically, a wafer is rotated about an axis that passes through its center and is perpendicular to its planar plating surface. This helps to dislodge bubbles through centrifugal force, but many of the smaller bubbles are tenacious in their attachment to the wafer. Another problem associated with immersion of a horizontally oriented wafer is multiple wetting fronts. When a wafer is immersed in this way, the electrolyte contacts the wafer at more than one point, creating multiple wetting fronts as the wafer is submerged in the electrolyte. Where individual wetting fronts converge, bubbles may be trapped. Also, defects in the finished plating layer can be propagated from microscopic unwetted regions formed along convergence lines of multiple wetting fronts.

Various methods have been suggested for avoiding problems commonly encountered in deposition of metal, particularly electroplating of copper, in integrated circuit fabrication. For example, U.S. Pat. No. 6,551,487, issued Apr. 22, 2003, to Reid et al., which is hereby incorporated by reference, teaches a method and an apparatus for controlling the angle and speed of wafer immersion into a plating solution to reduce multiple wetting fronts and air bubble formation on the substrate surface and, thereby, to reduce electroplating defects. U.S. Pat. No. 6,551,487 teaches that an angle of about 5 degrees to horizontal and a slow immersion speed of about 12 millimeter (mm) per second is effective for minimizing bubble formation. Co-owned and co-pending United States Patent Application Publication Number 2008/0149489, published Jun. 26, 2008, by Varadarajan et al., having the title "Multistep Immersion of Wafer into Liquid Bath", which is hereby incorporated by reference, teaches a short pause time during the wafer immersion process to avoid bubble formation on the wafer surface.

As the industry transitions to design nodes of 90 nm and smaller, proper wetting of embedded features (i.e., the displacement of gas from the spaces within features and its replacement with plating solution) favors a relatively high shear force on the wafer. A high shear force, however, is inconsistent with the technique of using a relatively slow wafer immersion speed to minimize bubble formation and resulting defects. Also, even with angled immersion of a wafer into a plating bath, bubbles still have a tendency to form and to be trapped near the outer edge of the wafer surface where a wafer holder encompasses the wafer edge. For example, FIG. 2 depicts schematically a plating system 122 of the prior art in which bubbles 124 are trapped at the outer edge region 126 of wafer surface 128 by the outer lower edge 130 of wafer holder 132. When the leading lower edge 130 of a wafer holder 132 and the leading outer edge region 126 of wafer surface 128 pierce the liquid surface 134 of a plating bath 136, a turbulent zone is created and small air bubbles contact the leading edge 124 of the wafer. This can lead to an on-wafer defect referred to as a C-line defect. A C-line defect shows up as an arc-shaped defect pattern at the very edge of the wafer. The C-line itself often consists of pits or comets which are killer-type defects. Further, a volume of air 140 is often trapped at the trailing lower edge 142 of wafer holder 132. This trapped air volume 140 arises in the void space created as a result of the trailing lower edge 142 being lower than the plane of wafer surface 128 near trailing lower edge 142. The design of wafer holder geometry reduces, but does not eliminate, this trapped air volume at trailing edge 142 of the wafer holder. Also, excessive turbulence is often generated at trailing edge 142 when a wafer holder reaches its plating position in a plating bath and tilts back to a 0° angle (usually horizontal) parallel to the plane of the anode 144. Bubbles thereby created deflect off the plating chamber wall 146 and contact wafer surface 128, rather than being expelled from the plating chamber.

U.S. Pat. No. 5,653,860, issued Aug. 5, 1997, to Nicholls et al., teaches using mechanical vibrations caused by an ultrasonic transducer to remove air bubbles from the surface of an article during electroplating. U.S. Pat. No. 6,797,135, issued Sep. 28, 2004, to Kim et al., teaches using sonic energy to generate minute bubbles from dissolved gases, which bubbles clean an object and thereby enhance electroplating. U.S. Pat. No. 6,224,713, issued May 1, 2001, to Hembree et al., teaches an ultrasonic etching technique in which ultrasonic waves create turbulence and cavities that mix an etching solution at a microscopic level, enhance concentration uniformity, and dislodge bubbles from the surface to be etched. U.S. Pat. No. 6,428,661, issued Aug. 6, 2002, to Hongo, teaches an ultrasonic oscillating member that prevents bubbles generated during electroplating from adhering to a semiconductor wafer. U.S. Pat. No. 6,626,196, issued Sep. 30, 2003, to Downes, Jr. et al., teaches ultrasonic degassing of electroplating liquid and ultrasonic degassing of high aspect ratio features prior to wet chemical processing.

SUMMARY OF THE INVENTION

The present invention helps to solve some of the problems outlined above by providing methods and systems for minimizing bubble formation and attachment of bubbles to the wafer surface during wafer immersion, while also providing sufficient shear force to achieve good wetting of features and good wafer-liquid mass transfer. The invention is described herein mainly with reference to the electroplating of thin copper films on 300 mm integrated circuit wafers. It is understood, however, that methods and systems in accordance with the invention are also useful for any process involving the immersion of a wafer into a liquid bath, including but not limited to processes for electrolytic metal plating, electroless metal plating metal, and immersion lithography.

A basic embodiment of a method in accordance with the invention for immersing a semiconductor wafer into a liquid bath comprises steps of: positioning a wafer having a planar wafer surface above a horizontal liquid surface of a liquid bath; positioning the wafer so that the planar wafer surface is tilted at an angle to a plane parallel to the horizontal liquid surface; while the wafer is tilted, moving the wafer downward toward the horizontal liquid surface so that a leading outer edge region of the planar wafer surface pierces the horizontal liquid surface; and applying sonic radiation in the liquid bath. Preferred embodiments include rotating the wafer as the leading outer edge region pierces the horizontal liquid surface. Preferably, sonic radiation is applied as the leading outer edge region pierces the horizontal liquid surface. In some embodiments, sonic radiation is applied to a wafer portion as the leading outer edge region pierces the horizontal liquid surface, and the wafer portion includes at least a part of the leading outer edge region of the planar wafer surface. In some embodiments, the wafer portion is substantially less than the total wafer surface area.

In some embodiments, applying sonic radiation to a wafer portion includes applying sonic radiation using a sonic transducer having a substantially planar radiating surface. In some embodiments, the substantially planar radiating surface is located in the liquid bath below the horizontal liquid bath surface and the substantially planar radiating surface is disposed substantially parallel to the horizontal liquid surface of the bath. In some embodiments, the radiating surface is located at a distance in a range of about from 10 millimeters (mm) to 30 mm below the horizontal liquid surface. In some embodiments, applying sonic radiation to a wafer portion comprises applying sonic radiation directed substantially normal (perpendicular) to the wafer portion of the planar wafer surface. In some embodiments, the radiating surface has a footprint area on the wafer not exceeding one-third of the total surface area of the wafer. In some embodiments, the radiating surface has a footprint area on the wafer having an arc angle not exceeding 90°. In some embodiments, the radiating surface has a footprint area on the wafer having an arc angle not exceeding 45°. In some embodiments, the radiating surface has a footprint area on the wafer having an arc angle not exceeding 30°. In some embodiments, the radiating surface has a footprint area on the wafer having an arc not exceeding 5°. In some embodiments, the footprint area of the radiating surface does not exceed one-twelfth of the total wafer surface area. In some embodiments, the footprint area of the radiating surface does not exceed one-fiftieth of the total wafer surface area. In some embodiments, the footprint area of the radiating surface does not exceed one-seventieth of the total wafer surface area. In some embodiments, not less than one-third of the footprint area of the radiating surface on the wafer is located within a radial distance on the wafer between the exposed peripheral edge of the wafer and 0.8 R (radius) from the wafer center. In some embodiments, not less than two-thirds of the footprint area of the radiating surface on the wafer is located within a radial distance on the wafer between the exposed edge of the wafer and 0.8R (radius) from the wafer center. In some embodiments, the sonic radiation consists substantially of megasonic radiation having a frequency not less than about 800 kHz. In some embodiments, sonic radiation is applied using a transducer power density corresponding to a range of about from 0.05 Watts per squared centimeter (W/cm$^2$) to 3.0 W/cm$^2$ of total wafer surface area. Some embodiments further comprise removing dissolved gas from the liquid bath using at least a partial vacuum before applying sonic radiation. Preferably, applying sonic radiation to wafer portion comprises generating substantially no cavitation in the liquid bath. In some embodiments, the radiating surface has a footprint area on the wafer having an arc angle not exceeding 45°; the radiating surface is located at a distance in a range of about from 10 millimeters (mm) to 30 mm below the horizontal liquid surface; the footprint area of the radiating surface does not exceed one-eighth of the total surface area of the wafer; and applying sonic radiation to a wafer portion comprises applying sonic radiation using a transducer power density corresponding to not less than 0.14 W/cm$^2$ of total wafer surface area. In some embodiments, the transducer power density corresponds to not more than 0.8 W/cm$^2$ of total wafer surface area. Some embodiments further comprise stopping downward movement of the wafer at a wafer treatment position at which the wafer portion in the wafer treatment position is located at a distance in a range of about from 3 mm to 8 mm above the radiating surface of the sonic transducer; and electroplating copper on the wafer in the wafer treatment position.

Accordingly, a basic embodiment of a liquid treatment system in accordance with the invention is operable to apply sonic radiation to avoid bubble formation on the surface of an integrated circuit wafer. Systems in accordance with the invention generally comprise: a liquid treatment chamber for holding a liquid bath; a wafer holder that is operable to position a wafer above a liquid bath, to rotate the wafer, to tilt the wafer at a non-horizontal angle, and to immerse a tilted wafer into the liquid bath; and a sonic transducer having a radiating surface located in the liquid treatment chamber. The sonic transducer is operable to direct sonic radiation through a liquid bath to a wafer portion of a planar wafer surface being immersed into the liquid bath, whereby the wafer portion includes a leading outer edge region of the planar wafer surface. In some embodiments, the wafer holder is operable to immerse a tilted wafer into a liquid bath so that the leading edge of the tilted wafer is separated from the radiating surface of the sonic transducer by a distance in a range of about from 10 mm to 30 mm. In some embodiments, the radiating surface of the sonic transducer is a substantially planar radiating surface that is located in the liquid treatment chamber and is disposed substantially horizontally. In some embodiments, the sonic transducer is operable to apply sonic radiation directed substantially normal (perpendicular) to the wafer portion of a planar wafer surface. In some embodiments, the radiating surface has a footprint area on the wafer having an arc not exceeding 90°. In some embodiments, not less than one-third of the footprint area of the radiating surface on the wafer is located within a radial distance on the wafer between the exposed edge of the wafer and 0.8R (radius) from the wafer center.

Other features, characteristics and advantages of embodiments in accordance with the invention will become apparent in the detailed description below.

BRIEF DESCRIPTION OF THE DRAWINGS

FIG. 15 depicts schematically a cross-sectional view of a generalized liquid treatment system in accordance with the invention;

FIG. 16 contains a process flow sheet of a generalized method in accordance with the invention for sonic irradiation of a wafer during immersion of the wafer into a liquid treatment bath;

DETAILED DESCRIPTION OF THE INVENTION

Figure 1:
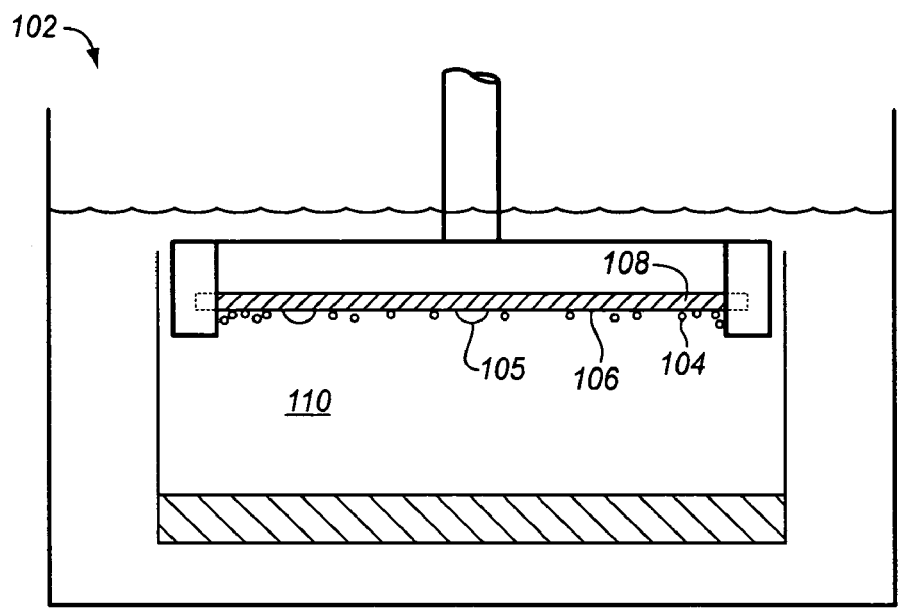
FIG. 1 depicts schematically a representative plating system of the prior art in which bubbles and air are trapped on a wafer surface after its immersion into a plating bath.
Figure 2:
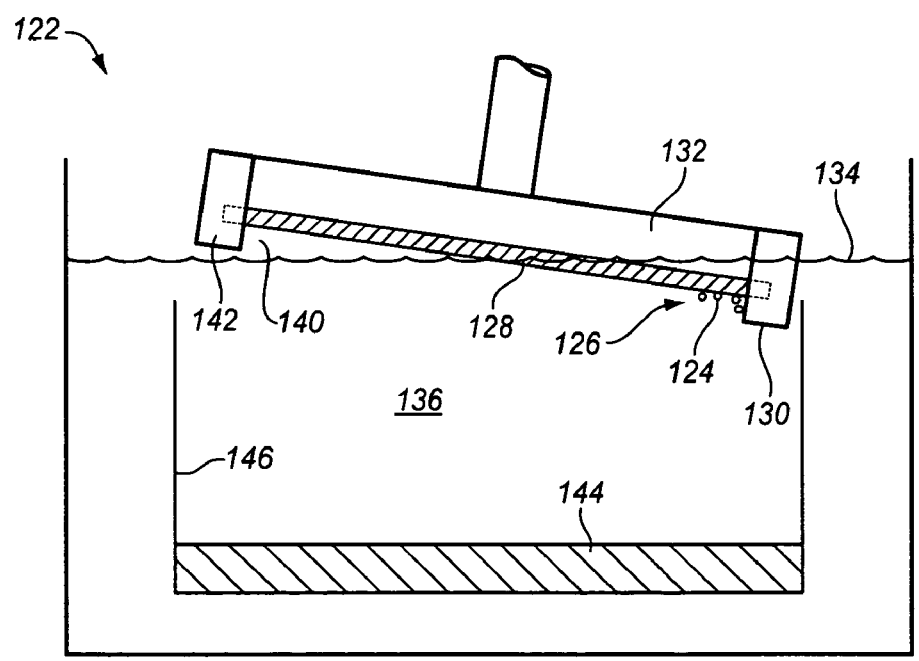
FIG. 2 depicts schematically a plating system in which bubbles and air are trapped at the outer edge region of a wafer surface by the outer lower edge of a wafer holder.

The invention is described herein with reference to FIGS. 3-29. It should be understood that the structures and systems depicted in schematic form in FIGS. 3-15, 17-22 are used to explain the invention and are not precise depictions of actual structures and systems in accordance with the invention. Similarly, methods in accordance with the invention described with reference to the process flow sheets contained in FIGS. 16 and 23 are exemplary. Similarly, the systems and methods described in Examples 1-4 below are exemplary. Some methods in accordance with the invention include additional steps and steps performed in somewhat different sequences from those described herein. Furthermore, the embodiments described herein are not intended to limit the scope of the invention, which is defined in the claims below. For the sake of clarity, parts and elements of various embodiments having similar structure and function are identified using the same reference numerals in the figures below.

In this specification, the terms "anode" and "cathode" refer to structures at which an oxidation and reduction process occur, respectively. In descriptions of electroplating systems and methods, the term "cathode" refers to the workpiece, typically an integrated circuit wafer, and the term "anode" refers to the counter-electrode. Methods in accordance with the invention, however, are generally useful for performing liquid treatment of semiconductor wafers in which the avoidance of bubble formation and bubble adhesion to the surface of the wafer substrate is undesirable. For example, sonic irradiation during immersion of a semiconductor wafer is useful to avoid the undesirable presence of bubbles during electroless plating of metal onto the wafer surface.

Figure 3:
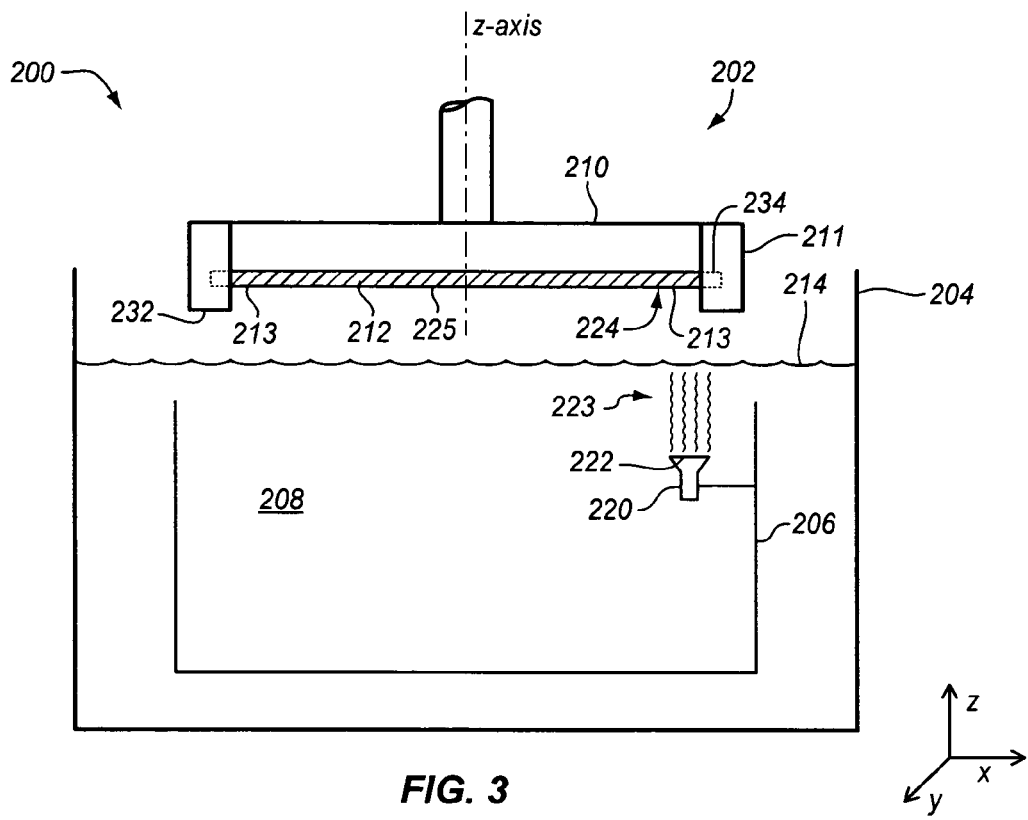
FIG. 3 depicts schematically a cross-sectional view of a generalized liquid treatment system in accordance with the invention.

FIG. 3 depicts schematically a cross-sectional view 200 of a generalized liquid treatment system 202 in accordance with the invention. System 202 comprises a liquid treatment cell 204 that includes a liquid treatment chamber 206. Liquid treatment chamber 206 is operable to hold liquid treatment bath 208 that is utilized for liquid treatment (e.g., electrolytic plating, electroless plating) of a semiconductor wafer. System 202 further comprises wafer holder 210 having outer holder edge 211 that is operable to hold a semiconductor wafer 212 and to transport wafer 212 having outer wafer edge region 213 vertically along the Z-axis depicted in FIG. 3. Wafer 212 is depicted in FIG. 3 in a substantially horizontal position, parallel to the top horizontal liquid surface 214 of liquid bath 208. Wafer holder 210 is further operable to tilt wafer 212 about its Z-axis and to move and hold wafer 212 in such a position that it forms an angle to the horizontal X-Y plane of liquid surface 214. Wafer holder 210 is further operable to rotate wafer 212 while transporting wafer 212 downward into liquid bath 208.

System 202 further comprises sonic transducer 220 having a radiating surface 222, which radiating surface 222 is located in liquid treatment chamber 206. Sonic transducer 220 is operable to direct sonic radiation 223 upwards through liquid bath 208 substantially normal to a wafer portion 224 of planar wafer surface 225 of wafer 212 while wafer 212 is being immersed into liquid bath 208 and as a leading outer edge pierces liquid surface 214. Wafer portion 224 to which sonic radiation 223 is directed is substantially less than the total surface area of wafer surface 225 and the portion includes at least a part of leading outer edge region 213 of wafer surface 224.

During immersion of wafer 212 into plating bath 208 in accordance with the invention, wafer 212 and wafer surface 225 are in a tilted position at an angle to horizontal, usually in a range of about from 1° to 6°, as the leading edge of wafer holder 210 and wafer 212 pierce top liquid surface 214 of liquid bath 208. In some embodiments in accordance with the invention, radiating surface 222 of sonic transducer 220 is disposed in liquid treatment chamber 206 so that it is located at a depth in a range of about from 10 mm to 30 mm from liquid surface 214 when a liquid bath 208 suitable for liquid treatment is present in liquid treatment chamber 206. In some embodiments, substantially planar (or flat) radiating surface 222 is horizontal, that is, parallel to liquid bath surface 214.

Figure 4:
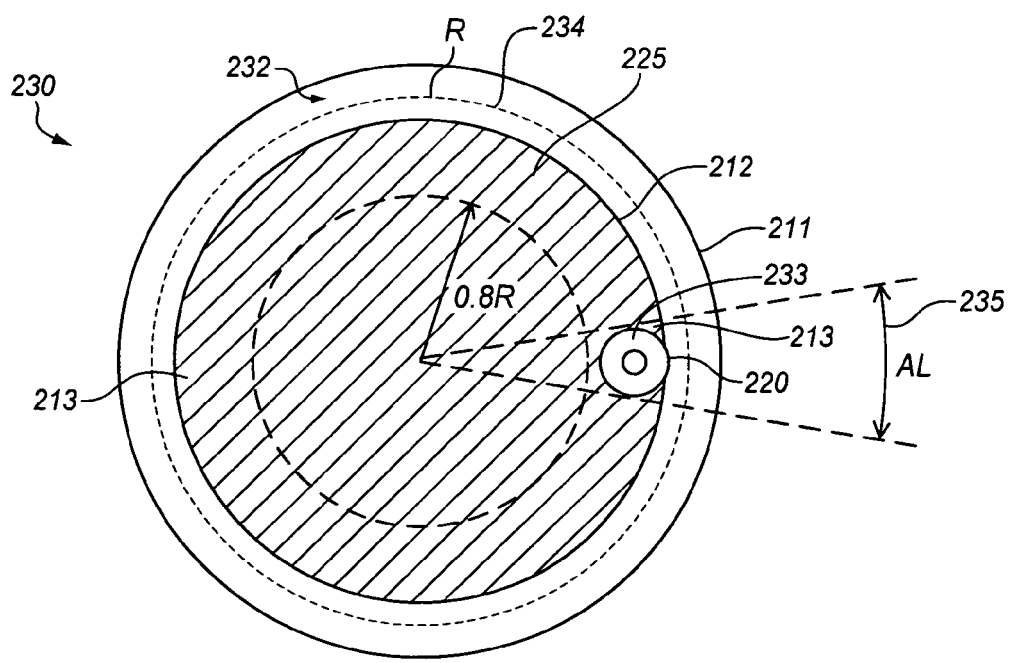
FIG. 4 depicts schematically a view from the bottom of the treatment chamber depicted in FIG. 3 upwards towards the wafer holder and wafer surface.

FIG. 4 depicts schematically a view 230 from the bottom of treatment chamber 206 upwards towards wafer holder 210 and wafer surface 225 of wafer 212. View 230 includes the bottom surface 232 of wafer holder edge 211, which encloses wafer surface 225 of wafer 212. FIG. 4 also depicts superimposed circular footprint 233 of sonic transducer 220 in outer edge region 213 of wafer surface 224. As depicted in FIG. 4, footprint 233 of radiating surface 222 (FIG. 3) has a footprint area on wafer 212 not exceeding one-twentieth (1/20) of the total surface area of wafer 212. In some embodiments, footprint 233 has a footprint area on wafer 212 not exceeding one-fiftieth (1/50) of the total surface area of wafer 212. In some embodiments, footprint 233 has a footprint area on wafer 212 not exceeding one-seventieth (1/70) of the total surface area of wafer 212. Also, footprint 233 of radiating surface 222 has a footprint area on wafer 212 having an arc angle 235 of about 15°. Generally, footprint 233 of radiating surface 222 has a footprint area on wafer 212 having an arc angle 235 in a range of about from 5° to 30°. Substantially all of the footprint area of footprint 233 of sonic transducer 220 is located within outer edge region 213 of wafer surface 224 defined as the region between radial distance 0.8R (radius of wafer) from the wafer center and 1.0R. In some embodiments in accordance with the invention, footprint 233 corresponds approximately to wafer portion 224.

The term "directed" used in this specification with reference to sonic radiation means that sonic radiation is being focused towards a particular area of a substrate wafer surface so that a greater concentration of sonic radiation impinges that particular area compared to the concentration of sonic radiation impinging other areas of the wafer surface and other surfaces in the treatment chamber. In some embodiments in accordance with the invention, a sonic transducer having a substantially planar (or flat) surface is operable to direct sonic radiation in a direction substantially normal (perpendicular) to the planar surface.

Figure 6:
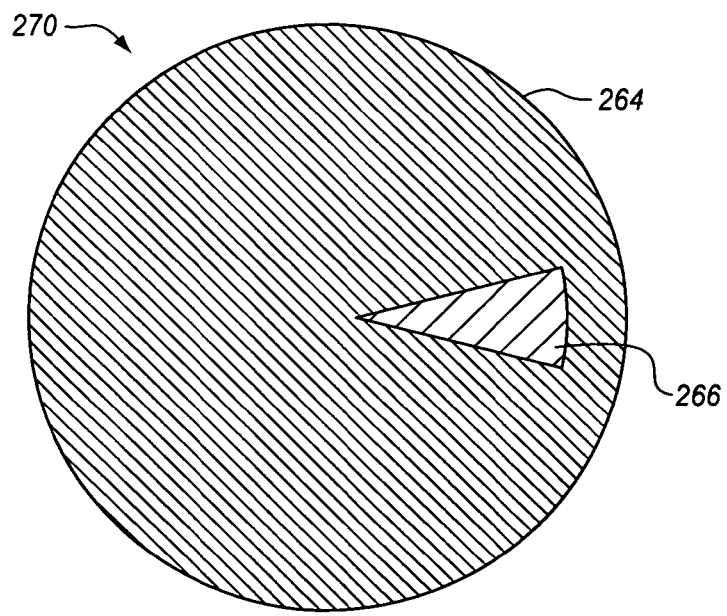
FIG. 6 depicts schematically a top-down view of the wedge-shaped sonic transducer embedded in the flow distribution element of the system depicted in FIG. 5.
Figure 7:
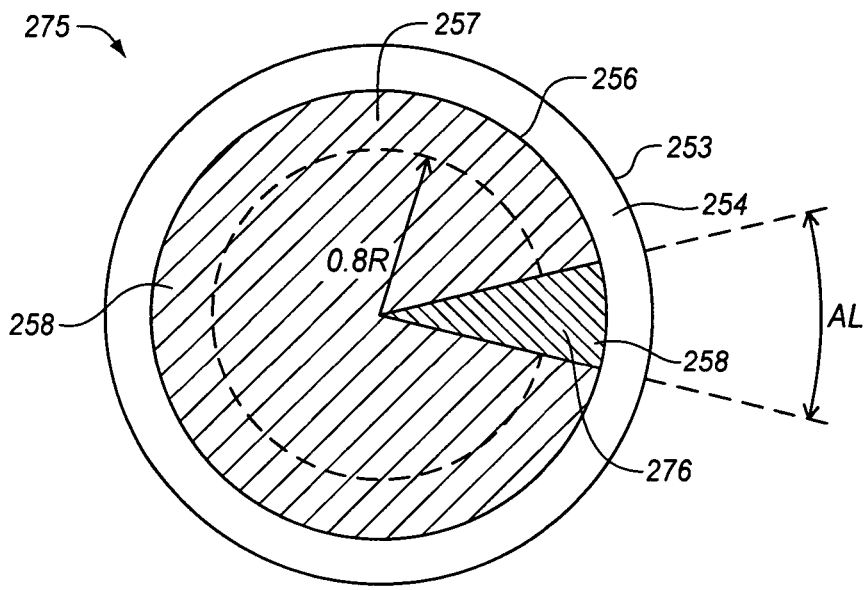
FIG. 7 depicts schematically a view from the bottom of the treatment chamber in FIG. 5 upwards towards the wafer holder and wafer surface, excluding the flow distribution element.

Generally, the term "arc angle" (or central arc angle) generally defines a distance measured in degrees between two radial segments forming the outer peripheral edge of a circular wedge, such as the wedge-shaped sonic transducer 266 depicted in FIG. 6 and wedge-shaped footprint 276 depicted in FIG. 7. In this specification, the term "arc angle" also refers to a distance measured in degrees between two radial segments that define the widest boundaries of any arbitrary shape with reference to a substantially circular wafer. For example, in FIG. 4, the term "arc angle" refers to arc angle (AL) 235 formed by the dashed radial segments defining the widest boundaries of footprint 233 of sonic transducer 220. Similarly, the term "arc angle" also refers to the distance, AL, measured between the dashed radial segments enclosing the corner boundaries of quadrangle-shaped footprint 322 depicted in FIG. 10.

The terms "total wafer surface area", "total surface area of wafer" and related terms as used in this specification refer to the total surface area of wafer as would be calculated using the nominal diameter of the wafer, without considering increased surface area arising as a result of wafer topography or decreased exposed surface area resulting from clamping and sealing off of the outer peripheral edge of a wafer by a wafer holder.

The term "outer edge region" and related terms used in this specification with reference to the exposed surface of a wafer generally means a ring-shaped region of the wafer surface between about 0.8R (radius) from the center of a wafer to the radially furthest exposed part of the wafer where a wafer holder encloses the wafer's peripheral edge. Nevertheless, since the radius of the exposed wafer surface is typically within one to three mm of the nominal radius value, R, at the peripheral outer edge 234 of a wafer (FIG. 4), the term R (wafer radius) is used herein interchangeably to mean the actual or nominal radius dimension of a wafer and the radius of the exposed wafer surface. For example, as depicted in FIG. 3, the outer peripheral edge 234 of wafer 212 is clamped down and sealed off by wafer holder edge 211. As a result, the surface area of wafer 212 at outer peripheral edge 234 is not exposed surface area. Typically, a wafer holder in accordance with the invention clamps down on only the outer one to two millimeters at the periphery of a wafer. The sealed-off non-exposed surface area shielded by the wafer holder generally amounts to less than five percent of the total surface area of the wafer.

The term "footprint area" and related terms used with reference to the footprint of a radiating surface of a sonic transducer on a wafer means the footprint area of a radiating surface directed substantially normally (i.e., perpendicular) to the wafer. Therefore, comparisons of footprint area to total wafer surface area refer to the footprint corresponding to a radiating surface aligned to emit (radiate) sonic energy perpendicular to the wafer surface. Generally, the radiating surface of the sonic transducer in accordance with the invention is aligned to emit sonic energy perpendicular (vertically in FIG. 3) to a horizontal wafer surface. In preferred embodiments in accordance with the invention, during immersion of a wafer into a liquid treatment bath, the wafer is tilted at an angle to horizontal, while the alignment of the radiating surface of the sonic transducer usually remains unchanged so that sonic energy might not be emitted exactly normal (perpendicular) to the wafer surface. Nevertheless, since the angle to horizontal is generally in a range of about from 1° to 6°, typically about 3°, the ratio of footprint area to total wafer surface area is not substantially changed from the ratio obtaining when the wafer is horizontal.

In this specification, the word "leading" refers to a part of a tilted wafer or structure that is lower than other parts of the same wafer or structure as it moves vertically downwards towards, into and through a liquid bath and, therefore, "leads" other parts of the wafer or structure in the downward direction. The terms "leading outer edge region", referring to a region of a wafer, "leading lower outer holder edge", referring to part of the wafer holder, and related terms have a meaning that is generally related to an instant in time because in preferred systems and methods in accordance with the invention, a wafer is rotating as it is being immersed into a liquid bath. In most embodiments (although not necessarily all), the part of the wafer holder in which the wafer is located is also rotating. Therefore, a rotating wafer or structural part that is leading at one instant is no longer leading a finite but short time later until it completes another rotation. Of course, when a wafer or structural element is not rotating, then a "leading" part of the wafer or element remains leading until some change in orientation (e.g., from a tilted, angled position to a horizontal orientation) is effected. In embodiments in which downward movement of the wafer into the liquid treatment bath is continued without interruption until the planar wafer surface is fully immersed in the bath, the "leading" part of the wafer is continuously increasing in a sense, and after the wafer is one-half immersed, the "trailing" part of the wafer decreases continuously until the wafer is fully immersed. In some embodiments, downward movement of the wafer into the liquid treatment bath is interrupted for a pause time after the leading edge of the wafer holder or of the wafer or of both has pierced the surface. Since the wafer is rotating during wafer immersion in accordance with the invention, the arc angle of the leading outer edge region of the wafer is generally not of primary importance. It is, however, important that in some embodiments (but not in all embodiments), sonic radiation is focused at the outer edge region of the planar wafer surface nearest the outer periphery of the exposed wafer surface where gas bubbles and pockets of air and other gas tend to accumulate. Accordingly, for descriptive purposes in this specification, the term "leading outer edge region" can be understood to mean a region at the leading edge of the wafer being immersed, which region has an arbitrary arc angle but which extends radially inwards a distance of approximately 5 mm from the extreme outer periphery of the exposed part of the planar wafer surface.

It is a feature of some embodiments in accordance with the invention that sonic energy in the form of sonic radiation is directed to a wafer portion of a wafer, which wafer portion has an area that is substantially less than the total surface area of the wafer. Sonic radiation is directed to a wafer portion in accordance with the invention using one or more techniques, including but not limited to: using a sonic transducer having a radiating surface that is substantially parallel to the planar wafer surface and directing the sonic radiation substantially normal (perpendicular) to the portion of the planar wafer surface to which sonic energy is to be applied; locating the radiating surface relatively close to the wafer portion to minimize undesired divergence and dissipation of the sonic radiation; using sonic radiation having short wavelength (e.g., megasonic radiation), which is more effectively focused than longer wavelength radiation. Of course, it is understood that some amount of sonic energy travels to all regions of a liquid bath in which a radiating surface of a sonic transducer is located and that some amount of sonic energy, however small, inevitably reaches parts of a wafer surface not included in the wafer portion to which sonic radiation is intentionally directed. Nevertheless, by directing sonic radiation to a relatively small portion of a rotating wafer surface, bubbles occurring during wafer immersion are removed from the rotating wafer surface, and the total amount of applied sonic radiation is minimized, thereby avoiding cavitation. Accordingly, selection of a transducer having an appropriate shape and transducer surface area is important. On the one hand, the surface area must be small enough and appropriately shaped to direct (or focus) effectively sonic radiation to a desired portion of the wafer (e.g., to the leading outer edge). On the other hand, the selected transducer surface area must be large enough to radiate sufficient sonic energy to the wafer surface, while avoiding such high sonic power density at the transducer surface (or in the liquid bath) that cavitation could occur. In some embodiments, not less than 80 percent (%) of the total amount of sonic energy reaching the planar wafer surface reaches the wafer portion, which is substantially less than the total exposed wafer surface area and which includes the leading outer edge region of the wafer surface. In other words, in such embodiments, only 20% or less of the total amount of sonic energy reaching the planar wafer surface diverges and does not reach the intended wafer portion. For example, in some embodiments of methods and systems in accordance with the invention using a system similar to system 202 described with reference to FIGS. 3 and 4, 80% or more of the total amount of sonic energy 223 reaching planar wafer surface 225 reaches wafer portion 224, whereby the surface area of wafer portion 224 corresponds approximately to footprint 233. In some embodiments, not less than 80 percent (%) of the total amount of generated sonic energy reaches the wafer portion.

In this specification, systems are described in which a sonic transducer and its radiating surface are disposed within a liquid treatment chamber. It is understood, however, that in some embodiments in accordance with the invention, part of a sonic transducer is located outside of the liquid treatment chamber, while the radiating surface of the sonic transducer is located within the chamber in order to radiate sonic energy in a liquid bath.

Figure 5:
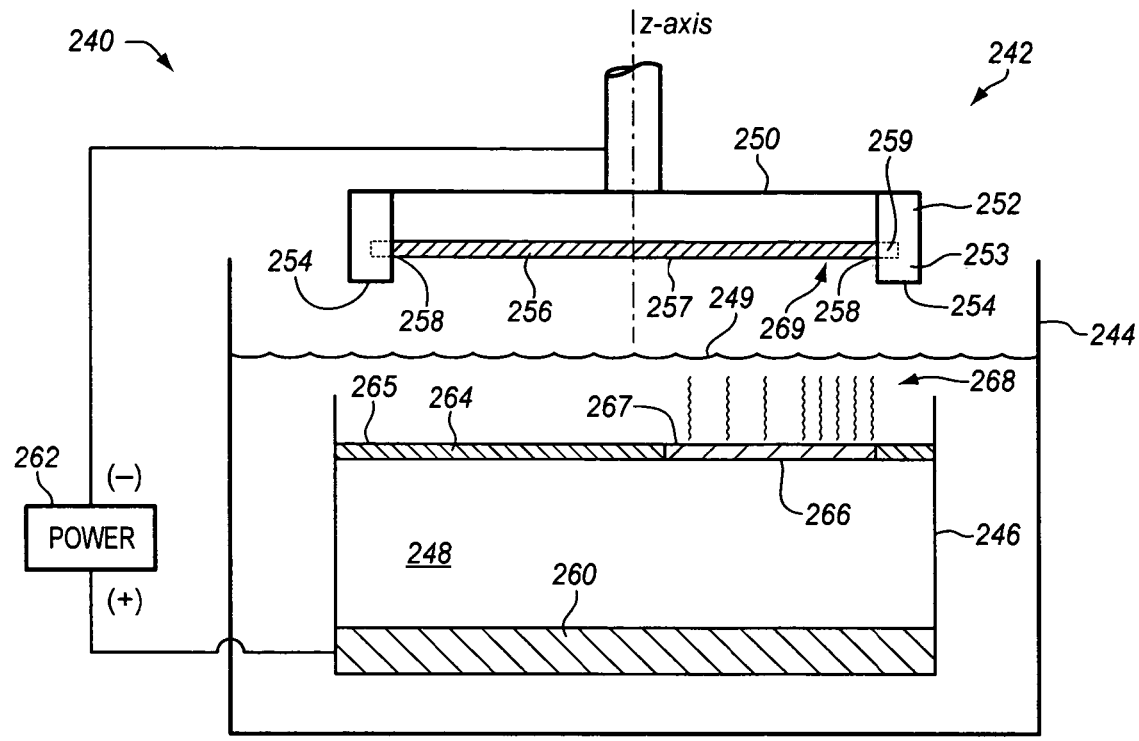
FIG. 5 depicts schematically a cross-sectional view of a generalized liquid treatment system in accordance with the invention.

FIG. 5 depicts schematically a cross-sectional view 240 of a generalized liquid treatment system 242 in accordance with the invention operable for electroplating (electrolytic plating) metal onto a semiconductor wafer. System 242 comprises an electroplating cell 244 that includes a plating chamber 246. Plating chamber 246 is operable to hold electroplating bath 248 that is utilized for metal plating of a semiconductor wafer. Electroplating bath 248 has a top liquid surface 249. System 242 further comprises wafer holder 250 having outer holder edge 252, which includes lower outer holder edge 253 having lower outer holder edge bottom 254. Wafer holder 250 is operable to hold a semiconductor wafer 256, which has wafer surface 257 and outer edge region 258. Typically, as depicted in FIG. 5, wafer holder 250 is designed to clamp and enclose outer peripheral edge 259 of wafer 256. Wafer holder 250 is operable to transport wafer 256 vertically along the Z-axis depicted in FIG. 5. Wafer 256 is depicted in FIG. 5 in a substantially horizontal position, parallel to top liquid surface 249 of liquid bath 248. Wafer holder 250 is further operable to tilt wafer 256 about its Z-axis and to move and hold wafer 256 in such a position that it forms an angle to the horizontal X-Y plane of liquid surface 249. Wafer holder 250 is further operable to rotate wafer 256 while transporting wafer 256 downward into liquid bath 248.

System 242 further comprises anode 260 located in plating chamber 246 and a power supply 262. A positive lead of power supply 262 is connected to anode 260, and a negative lead of power supply 262 is connected to wafer holder 250, which provides electrical connection to outer peripheral edge 259 of wafer 256. U.S. Pat. No. 6,436,249, issued Aug. 20, 2002, to Patton et al., which is hereby incorporated by reference, teaches a wafer holder utilized for electroplating a wafer surface, which wafer holder has a cup having a central aperture defined by an inner parameter, a compliant seal adjacent the inner parameter, electrical contacts adjacent to the compliant seal, and a cone attached to a rotatable spindle. System 242 further comprises substantially circular porous flow distribution element 264, located in plating chamber 246 above anode 260. Flow distribution element 264 has a top surface 265. A flow distribution element serves to enhance uniform flow of electrochemical processing liquid towards a treatment surface 257 during liquid treatment. In some embodiments, as depicted in FIG. 5, flow distribution element 264 is substantially coextensive with anode 260 and treatment surface 257 of wafer 256. U.S. Pat. No. 6,964,792, issued Nov. 15, 2005, to Mayer et al., which is incorporated by reference, teaches a diffuser membrane for fluid control during electrochemical processing that is adaptable to serve as a flow diffuser plate that promotes uniform flow distribution of fluid when a wafer 256 is in a lowered, plating (or other liquid treatment) position.

In accordance with the invention, system 242 further includes sonic transducer 266 having radiating surface 267. As depicted in FIG. 5, radiating surface 267 of sonic transducer 266 is embedded in flow distribution element 264 in plating chamber 246 above anode 260. In some embodiments, radiating surface 267 is substantially planar. In system 242, radiating surface 267 is substantially flush with the top surface 265 of flow distribution element 264, as depicted in FIG. 5. Radiating surface 267 is substantially parallel to liquid bath surface 249. Sonic transducer 266 is operable to direct sonic radiation 268 upwards through liquid bath 248 substantially normal to a wafer portion 269 of planar wafer surface 257 of wafer 256 while a wafer 256 (preferably in a tilted position, not shown) is being immersed at an angle into liquid bath 248 and as the leading outer edge pierces liquid surface 249. Wafer portion 269 of wafer surface 257, at which sonic radiation 268 is directed, is substantially less than the total surface area of wafer surface 257, and wafer portion 269 includes at least a part of leading outer edge region 258 of wafer surface 257.

FIG. 6 depicts schematically a top-down view 270 of wedge-shaped sonic transducer 266 embedded in flow distribution element 264.

FIG. 7 depicts schematically a view 275 from the bottom of treatment chamber 246 upwards towards wafer holder 250 and wafer surface 257 of wafer 256, excluding flow distribution element 264. View 275 includes the bottom 254 of lower outer holder edge 253, which holder edge surrounds wafer surface 257 of wafer 256. FIG. 7 also depicts superimposed wedge-shaped footprint 276 of sonic transducer 266, which footprint extends radially outwards from the center axis (Z-axis) of wafer 256 to outer edge region 258 of wafer surface 257. The footprint 276 of radiating surface 267 corresponds approximately to wafer portion 269 (FIG. 5). As depicted in FIG. 7, the footprint 276 of radiating surface 267 has a footprint area on wafer 256 not exceeding about one-twelfth of the total surface area of wafer 256. Also, the footprint of radiating surface 267 has a footprint area on wafer 212 having an arc angle, AL, of about 30°. About one-third of the footprint area of radiating surface 222 on wafer 212 is located within outer edge region 258 defined by a radial distance of 0.8R from the wafer center and the exposed edge of the wafer (approximately R). In some embodiments, 80% or more of the total amount of sonic radiation 268 reaching planar wafer surface 257 reaches wafer portion 269, which corresponds approximately to footprint 276. In some embodiments, 80% or more of the total amount of sonic radiation 268 generated in treatment chamber 246 reaches wafer portion 269.

Figure 8:
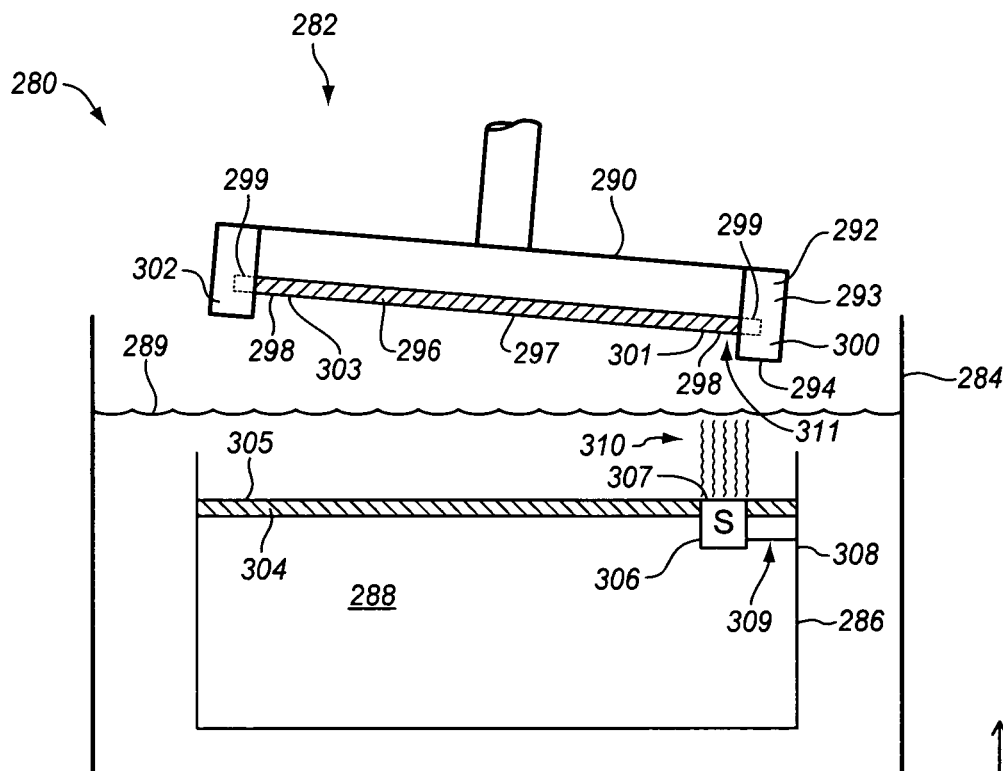
FIG. 8 depicts schematically a cross-sectional view of a generalized liquid treatment system in accordance with the invention.

FIG. 8 depicts schematically a cross-sectional view 280 of a generalized liquid treatment system 282 in accordance with the invention. System 280 comprises a liquid treatment cell 284 that includes a treatment chamber 286. Treatment chamber 286 is operable to hold liquid treatment bath 288 that is utilized to treat a semiconductor wafer. Liquid treatment bath 288 has a top liquid surface 289. System 282 further comprises wafer holder 290 having outer holder edge 292, which includes lower outer holder edge 293 having lower outer holder edge bottom 294. Wafer holder 290 is operable to hold a semiconductor wafer 296, which has planar wafer surface 297 and outer edge region 298. Typically, as depicted in FIG. 8, wafer holder 290 is designed to clamp wafer 296 at its outer peripheral edge 299. Wafer holder 290 is operable to transport wafer 296 vertically along the Z-axis. Wafer 296 is depicted in FIG. 8 in a tilted position so that it forms an angle to the horizontal X-Y plane of liquid surface 289, typically an angle in a range of about from 1° to 6°. Wafer holder 290 is further operable to re-orient wafer 296 about its Z-axis to different angles or to horizontal (0° angle). Wafer holder 290 is further operable to rotate wafer 296 while transporting wafer 296 downward into liquid bath 288.

In the orientation of wafer holder 290 and wafer 296 depicted in FIG. 8, wafer holder 290 and wafer 296 are tilted at an angle to horizontal liquid surface 289. As depicted in the FIG. 8, during immersion of tilted wafer 296 into liquid treatment bath 288, leading lower outer holder edge 300 and leading outer edge region 301 of wafer 296 pierce horizontal liquid surface 289 before other parts of tilted wafer 296 and wafer holder 290. Trailing lower outer holder edge 302 and trailing outer edge region 303, located opposite (i.e., approximately 180° arc angle separation) to leading lower outer holder edge 300 and leading outer edge region 301, pierce horizontal liquid surface 289 lastly, that is, after other parts of tilted wafer 296 and wafer holder 290 have been immersed.

System 282 further comprises substantially circular porous flow distribution element 304 located in plating chamber 286. Flow distribution element 304 has a top surface 305. A flow distribution element serves to enhance uniform flow of liquid treatment liquid towards a treatment surface 297 during liquid treatment. In some embodiments, as depicted in FIG. 8, flow distribution element 304 is substantially coextensive with treatment surface 297 of wafer 296.

In accordance with the invention, system 282 further includes sonic transducer 306 having radiating surface 307. As depicted in FIG. 8, sonic transducer 306 is located within treatment chamber 286 and is supported by treatment chamber sidewall 308 to which it is attached by supporting arm 309. in some embodiments, as depicted in FIG. 8, radiating surface 307 is substantially flat. In some embodiments, as depicted in FIG. 8, radiating surface 307 of sonic transducer 306 is substantially flush with the top surface 305 of flow distribution element 304. in some embodiments, sonic transducer 306 is operable to direct sonic radiation 310 upwards through liquid bath 288 substantially normal to a wafer portion 311 of planar wafer surface 297 of wafer 296 while tilted wafer 296 is being immersed at an angle into liquid bath 288 and as leading outer edge region 298 pierces liquid surface 289. In some preferred embodiments, radiating surface 307 is parallel to liquid surface 289. The wafer portion 311 at which sonic radiation 310 is directed is substantially less than the total surface area of wafer surface 297 and the portion includes at least part of leading outer edge region 298 of wafer surface 297.

Figure 9:
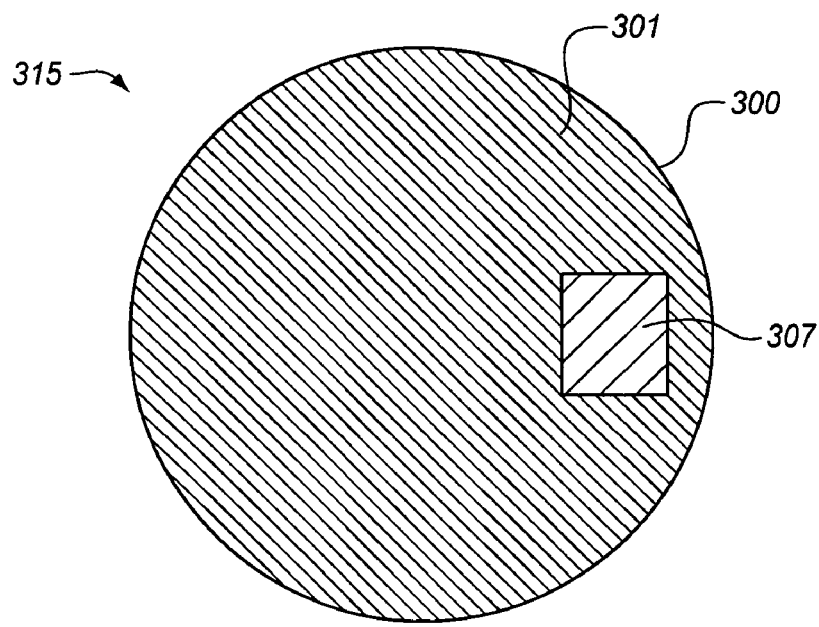
FIG. 9 depicts schematically a top-down view of the quadrangle-shaped radiating surface of the sonic transducer and top surface of the flow distribution element of FIG. 8.

FIG. 9 depicts schematically a top-down view 310 of quadrangle-shaped radiating surface 307 of sonic transducer 306 and top surface 305 of flow distribution element 304.

Figure 10:
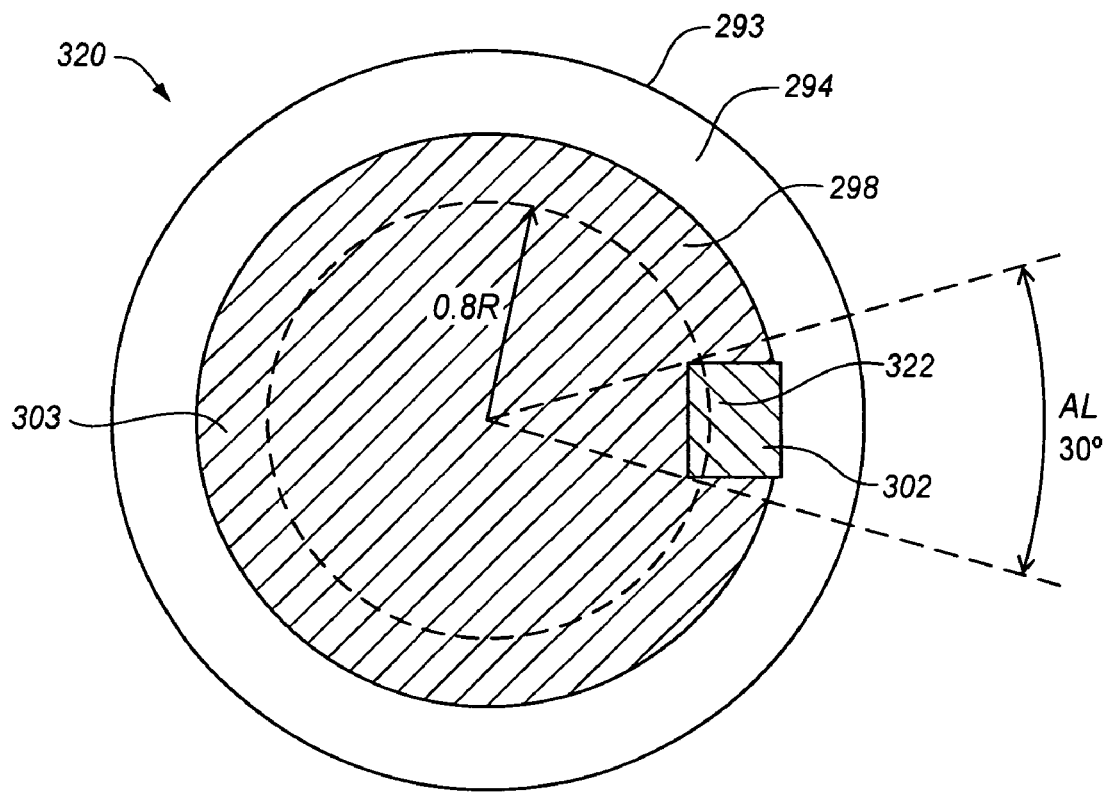
FIG. 10 depicts schematically a view from the bottom of the treatment chamber of FIG. 8 upwards towards the wafer holder and wafer surface, excluding the flow distribution element.

FIG. 10 depicts schematically a view 320 from the bottom of treatment chamber 286 upwards towards wafer holder 290 and wafer surface 297 of wafer 296, excluding flow distribution element 304. View 320 includes the bottom 294 of lower outer holder edge 293, which holder edge surrounds wafer surface 297 of wafer 296. FIG. 10 also depicts superimposed quadrangle-shaped footprint 322 of radiating surface 307 of sonic transducer 306, which footprint corresponds approximately to wafer portion 311 (FIG. 8). As depicted in FIG. 10, footprint 322 of radiating surface 307 has a footprint area on wafer 296 not exceeding about one-tenth (1/10) of the total surface area of wafer 296. Also, the footprint of radiating surface 307 has a footprint area on wafer 296 having an arc angle of about 30°. About two-thirds of the footprint area 322 of radiating surface 307 on wafer 296 is located within the outer edge region 298 defined by a radial distance of 0.8R from the wafer center and the exposed edge (approximately R) of wafer 296. In some embodiments, 80% of the total amount of sonic radiation reaching the total planar wafer surface 297 reaches wafer portion 301, which corresponds approximately to that part of footprint 322 that overlaps wafer 296 in FIG. 10. Thus, in such embodiments as system 282, since wafer portion 301 corresponds approximately to footprint 322, and since about two-thirds of footprint 322 overlaps outer edge region 298, at least two-thirds of 80% of the total amount of sonic radiation reaching the wafer surface reaches outer edge region 298. In some embodiments, 80% of the total amount of sonic radiation 310 generated in chamber 286 reaches wafer portion 301 of wafer surface 297.

In some embodiments, the footprint 322 of radiating surface 307 has a footprint area on wafer 296 not exceeding about one-twentieth (1/20) of the total surface area of wafer 296. In some embodiments, the footprint 322 of radiating surface 307 has a footprint area on wafer 296 not exceeding about one-fiftieth (1/50) of the total surface area of wafer 296. In some embodiments, the footprint 322 of radiating surface 307 has a footprint area on wafer 296 not exceeding about one-seventieth (1/70) of the total surface area of wafer 296. In some embodiments, the footprint of radiating surface 307 has a footprint area on wafer 296 having an arc angle in a range of a about from 5° to 30°.

In some embodiments, sonic energy is not directed substantially normal to the wafer surface generally or substantially normal to the planar wafer surface at an outer edge region of the wafer; instead, the sonic energy travels in waves that, at least to some extent, form an angle or angles to the wafer surface or portions of the wafer surface substantially less than 90°. Also, some embodiments in accordance with the invention include a plurality of sonic transducers or a plurality of radiating surfaces. A feature of preferred embodiments in accordance with the invention, however, is that a substantial amount of the total amount of applied sonic energy is able to be focused on to a portion of a wafer surface that includes the leading outer edge region of the wafer and which is substantially less than the total wafer surface area.

Figure 11:
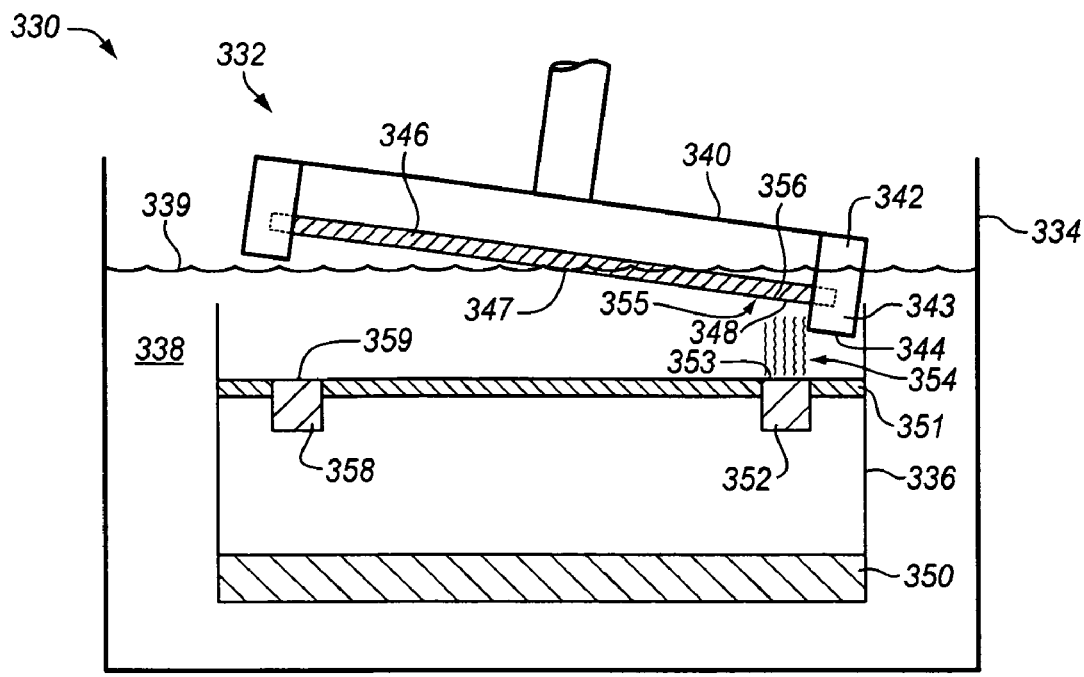
FIG. 11 depicts schematically a cross-sectional view of a generalized liquid treatment system in accordance with the invention.

FIG. 11 depicts schematically a cross-sectional view 330 of a generalized liquid treatment system 332 in accordance with the invention operable for electroplating metal onto a semiconductor wafer. System 332 comprises an electroplating cell 334 that contains a plating chamber 336. Plating chamber 336 is operable to hold electroplating bath 338 that is utilized for metal plating of a semiconductor wafer. Electroplating bath 338 has a top liquid surface 339. System 332 further comprises wafer holder 340 in accordance with the invention having outer holder edge 342, which includes lower outer holder edge 343 having lower outer holder edge bottom 344. Wafer holder 340 is operable to hold a semiconductor wafer 346, which has wafer surface 347 and outer edge region 348.

System 332 further comprises anode 350 and substantially circular porous flow distribution element 351, located in plating chamber 336 above anode 350. When embodiments in accordance with the invention are used in applications involving electroplating, a flow distribution element, such as flow distribution element 351, sometimes functions as a virtual anode (or high resistance virtual anode, HRVA). For example, U.S. Pat. No. 6,773,571, issued Aug. 10, 2004, to Mayer et al., which is hereby incorporated by reference, teaches methods and apparatuses for electroplating metal on a seed layer using multiple segmented virtual anode sources. In accordance with the invention, system 332 further includes sonic transducer 352 having radiating surface 353. Sonic transducer 352 is operable to direct sonic radiation 354 upwards through a liquid bath 338 to a wafer portion 355 of planar wafer surface 347 of wafer 346 while tilted wafer 346 is being immersed at an angle into liquid bath 338 and as leading outer edge region 356 pierces liquid surface 339. Wafer portion 355 at which sonic radiation 354 is directed is substantially less than the total surface area of wafer surface 347 and wafer portion 355 includes at least a part of leading outer edge region 356 of wafer surface 347.

System 332 further includes sonic transducer 358 having radiating surface 359. As depicted in FIG. 11, sonic transducer 358 is operable to direct sonic radiation using radiating surface 359 upwards through liquid bath 338 to a wafer portion of planar wafer surface 347 that is different from wafer portion 355. In some embodiments (not shown), sonic transducer 358 is operable to direct sonic radiation to a wafer portion of planar wafer surface 347 that overlaps at least partially with wafer portion 355

Figure 12:
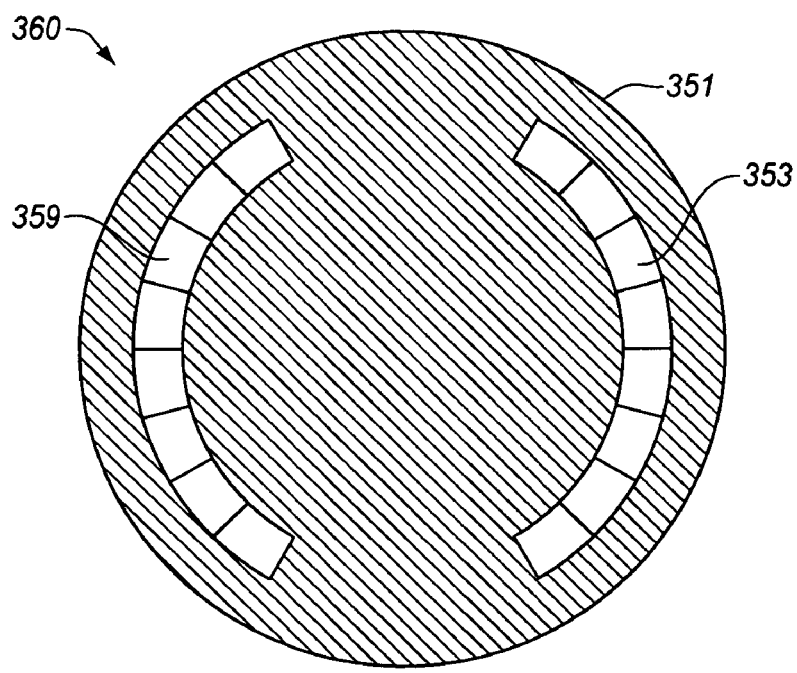
FIG. 12 depicts schematically a top-down view of the porous flow distribution element and arcuate-shaped radiating surfaces of the sonic transducers in the system of FIG. 11.

FIG. 12 depicts schematically a top-down view 360 of porous flow distribution element 351, arcuate-shaped radiating surface 353 of sonic transducer 352, and arcuate-shaped radiating surface 359 of sonic transducer 358. The footprint of radiating surface 353 has a footprint area on wafer 346 not exceeding about one-twelfth (1/12) of the total surface area of wafer 346. Also, the footprint of radiating surface 353 typically has a footprint area on wafer surface 347 having an arc angle in a range of about from 5° to 360°, more generally in a range of about from 5° to 120°. In some embodiments, substantially all of the footprint area of radiating surface 353 on wafer surface 347 is located within an outer edge region defined by a radial distance of 0.8R from the wafer center and the exposed edge of the wafer (approximately R). In some embodiments, the footprint of radiating surface 353 has a footprint area on wafer 346 not exceeding about one-twentieth (1/20) of the total surface area of wafer 346. In some embodiments, the footprint of radiating surface 353 has a footprint area on wafer 346 not exceeding about one-fiftieth (1/50) of the total surface area of wafer 346. In some embodiments, 80% or more of the total amount of sonic radiation 354 reaching planar wafer surface 347 reaches wafer portion 355. In some embodiments, 80% or more of the total amount of sonic radiation 354 generated in chamber 336 reaches wafer portion 355.

Figure 13:
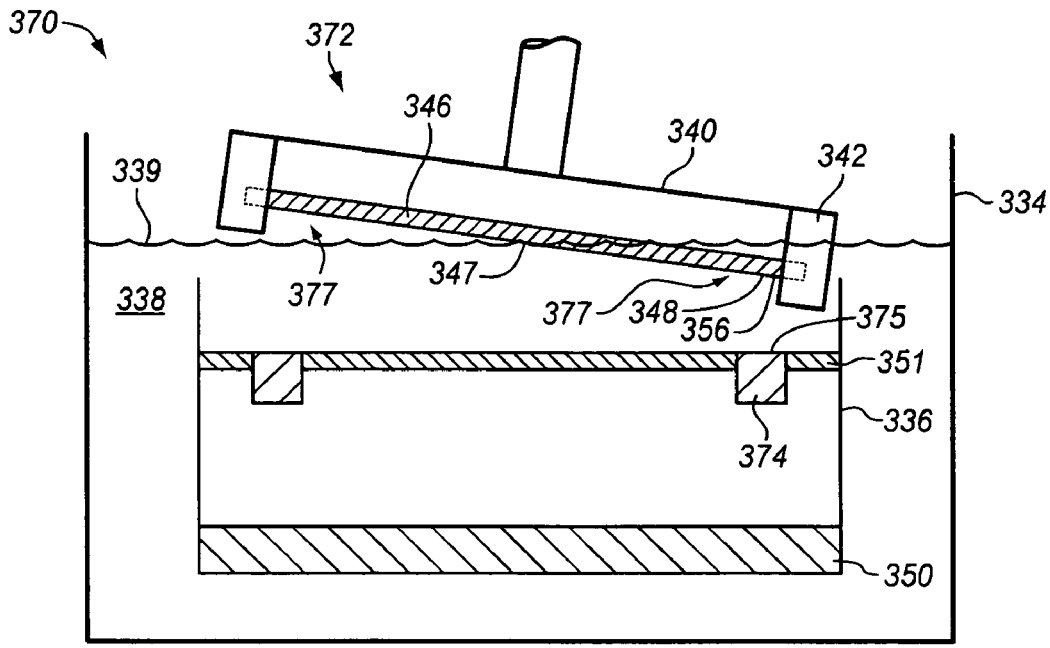
FIG. 13 depicts schematically a cross-sectional view of a generalized liquid treatment system in accordance with the invention comprising a sonic transducer having a ring-shaped radiating surface.

FIG. 13 depicts schematically a cross-sectional view 370 of a generalized liquid treatment system 372 in accordance with the invention operable for electroplating metal onto a semiconductor wafer. System 372 is similar to system 332 discussed with reference to FIGS. 11 and 12, except that system 372 comprises a sonic transducer 374 having a ring-shaped radiating surface 375. Sonic transducer 374 is operable to direct sonic radiation upwards through liquid bath 338 to a wafer portion 377 of planar wafer surface 347 of wafer 346 while tilted wafer 346 is being immersed at an angle into liquid bath 338 and as leading outer edge region 356 pierces liquid surface 339. The wafer portion 377 at which sonic radiation is directed is substantially less than the total surface area of wafer surface 347 and the portion includes at least a part of leading outer edge region 356 of wafer surface 347.

Figure 14:
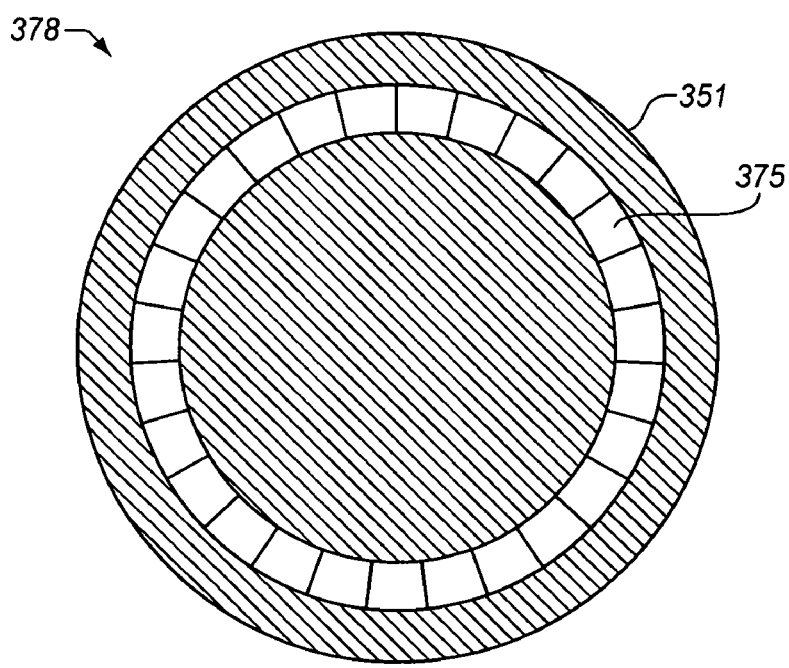
FIG. 14 depicts schematically a top-down view of the porous flow distribution element and ring-shaped radiating surface of the system depicted in FIG. 13.

FIG. 14 depicts schematically a top-down view 378 of porous flow distribution element 351 and ring-shaped radiating surface 375 of sonic transducer 374. The footprint of radiating surface 375 has a footprint area on wafer 346 not exceeding about one-third, preferably not exceeding one-fifth, of the total surface area of wafer 346. Also, in some embodiments, at least about one-half of the footprint area of radiating surface 375 on wafer surface 347 is located within an outer edge region defined by a radial distance of 0.8R from the wafer center and the exposed edge of the wafer (approximately R). In some embodiments, substantially all of the footprint area of radiating surface 375 on wafer surface 347 is located within an outer edge region defined by a radial distance of 0.8R from the wafer center and the exposed edge of the wafer (approximately R). In some embodiments, the footprint of radiating surface 375 has a footprint area on wafer 346 not exceeding about one-tenth of the total surface area of wafer 346. In some embodiments, the footprint of radiating surface 375 has a footprint area on wafer 346 not exceeding about one-twentieth of the total surface area of wafer 346. In some embodiments, the footprint of radiating surface 375 has a footprint area on wafer 346 not exceeding about one-fiftieth of the total surface area of wafer 346.

FIG. 15 depicts schematically a cross-sectional view 380 of a generalized liquid treatment system 382 in accordance with the invention operable for electroplating metal onto a semiconductor wafer. System 382 comprises an electroplating cell 334, plating chamber 336, and electroplating bath 338 having top liquid surface 339. System 382 further comprises wafer holder 340 in accordance with the invention having outer holder edge 342, which includes lower outer holder edge 343. Wafer holder 340 is operable to hold a semiconductor wafer 346, which has wafer surface 347 and outer edge region 348.

System 382 further comprises anode 350. In accordance with the invention, system 382 further includes sonic transducer 384 having radiating surface 386. Sonic transducer 384 is operable to direct sonic radiation 387 through liquid bath 338 to a wafer portion 388 of planar wafer surface 347 of wafer 346 while tilted wafer 346 is being immersed at an angle into liquid bath 338 and as leading outer edge region 356 pierces liquid surface 339. Wafer portion 388 at which sonic radiation 354 is directed is substantially less than the total surface area of wafer surface 347 and wafer portion 388 includes at least a part of leading outer edge region 356 of wafer surface 347. As depicted in FIG. 15, sonic radiation 387 is not directed substantially normal to planar wafer surface 347; rather it is directed at, and approximately perpendicular to, the seam 389 formed at the interface of leading outer edge region 356 and lower outer holder edge 343, at an angle to planar wafer surface 347 less than 90°. In some embodiments, 80% or more of the total amount of sonic radiation 387 reaching planar wafer surface 347 reaches wafer portion 388.

In some embodiments, 80% or more of the total amount of sonic radiation 387 generated in chamber 336 reaches wafer portion 388.

In some alternative embodiments, system 382 includes sonic transducer 390 having radiating surface 391 instead of transducer radiating surface 386 or in addition to radiating surface 386. Sonic transducer radiating surface 391 is located in plating chamber 336 (or liquid treatment chamber 336) substantially opposite to (i.e., about 180° arc angle from) the location where leading wafer holder edge 343 and leading outer edge region 356 pierce (i.e., initially break the surface of) plating bath 338. Radiating surface 391 is operable to direct sonic radiation 392 across treatment chamber 336 through liquid bath 338 to wafer portion 388 of planar wafer surface 347 of wafer 346 while tilted wafer 346 is being immersed at an angle into liquid bath 338 and as leading outer edge region 356 pierces liquid surface 339. As depicted in FIG. 15, sonic radiation 392 is not directed substantially normal to planar wafer surface 347; rather it is directed approximately at, and approximately perpendicular to, the seam formed at the interface of leading outer edge region 356 and lower outer holder edge 343, at an angle to planar wafer surface 347 less than 90°. In some embodiments, 80% or more of the total amount of sonic radiation 392 reaching planar wafer surface 347 reaches wafer portion 388. In some embodiments, 80% or more of the total amount of sonic radiation 392 generated within chamber 336 reaches wafer portion 388.

FIG. 16 contains a process flow sheet of a generalized method 400 in accordance with the invention for sonic irradiation of a wafer during immersion of a wafer into a liquid treatment bath. Method 400 is described herein with reference to FIGS. 17-21. It is understood, however, that some methods in accordance with the invention are practiced utilizing systems different from that depicted in FIGS. 17-21, and that in some methods in accordance with the invention some of the steps in the process flow sheet of FIG. 16 are conducted in a different sequence. FIGS. 17-21 depict cross-sectional views of a system 502 in accordance with the invention having a liquid treatment cell 504, a liquid treatment chamber 506, a wafer holder 508 and a sonic transducer 510 having radiating surface 511. As depicted in FIGS. 17-21, liquid treatment chamber 506 contains a liquid bath 512 comprising a liquid treatment liquid, typically a liquid treatment solution, such as an electrolytic plating solution. Liquid bath 512 has a horizontal top liquid bath surface 513. In some embodiments, radiating surface 511 of sonic transducer 510 is disposed in liquid treatment chamber 506 so that it is located at a depth in a range of about from 10 mm to 30 mm below liquid bath surface 513, preferably about 20 mm. Accordingly, the irradiation distance, 515, between the radiating surface 511 and the leading lower edge region 522 (FIG. 19) of a tilted wafer (as well as the leading lower outer holder edge) as it pierces the liquid bath surface 513 is in a range of about from 10 mm to 30 mm, preferably about 20 mm.

Figure 17:
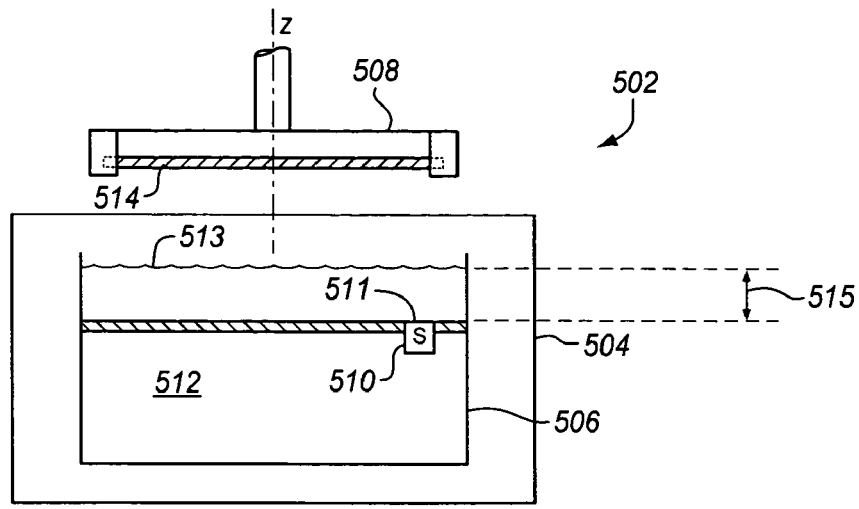
FIGS. 17-21 depict sequential views of a system in accordance with the invention in successive stages of the process flow sheet of FIG. 16.
Figure 18:
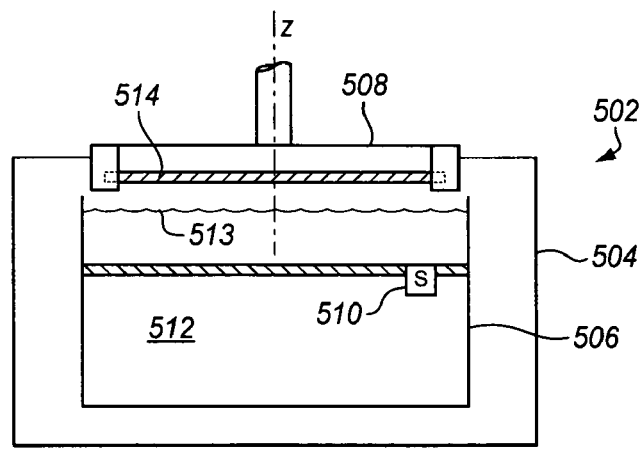

Step 410 includes loading a wafer 514 into wafer holder 508, such as a clamshell-type wafer holder described in U.S. Pat. No. 6,156,167, issued Dec. 5, 2002 to Patton et al. Step 410 further includes positioning wafer holder 508 and wafer 514 above liquid treatment chamber 506, as depicted in FIG. 17. Step 410 further includes then moving wafer holder 508 and wafer 514 vertically downward (along the Z-axis) into position for entry into liquid treatment chamber 506 and liquid bath 512, as depicted in FIG. 18. The entry position typically is in a range of about from 15 mm from the top of liquid bath 512 to 50 mm above the liquid bath 512. U.S. Pat. No. 6,551,487, issued Apr. 22, 2003, to Reid et al., which is incorporated by reference, teaches an apparatus operable to move a wafer along a trajectory normal to the top surface of a liquid bath and operable to adjust a wafer's orientation in the X, Y and Z-planes during immersion and during liquid treatment.

Figure 19:
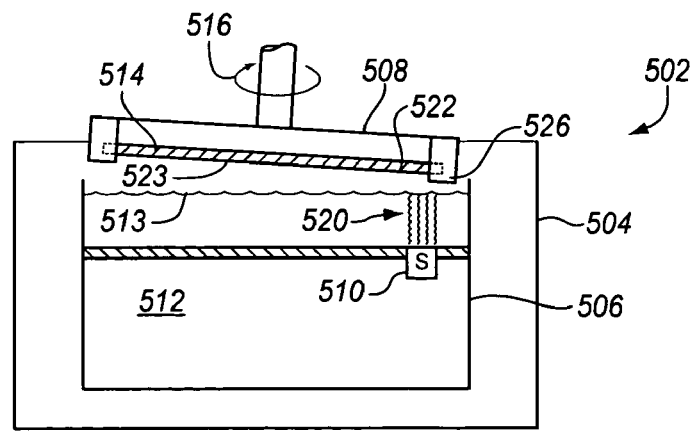

Step 420 includes tilting wafer 514 at an angle to horizontal so that wafer 514 makes an angle with a plane parallel to liquid bath surface 513, as depicted in FIG. 19. Generally, after tilting, wafer 514 makes an angle to horizontal in a range of about from 1° to 6°, preferably about 3°.

Figure 20:
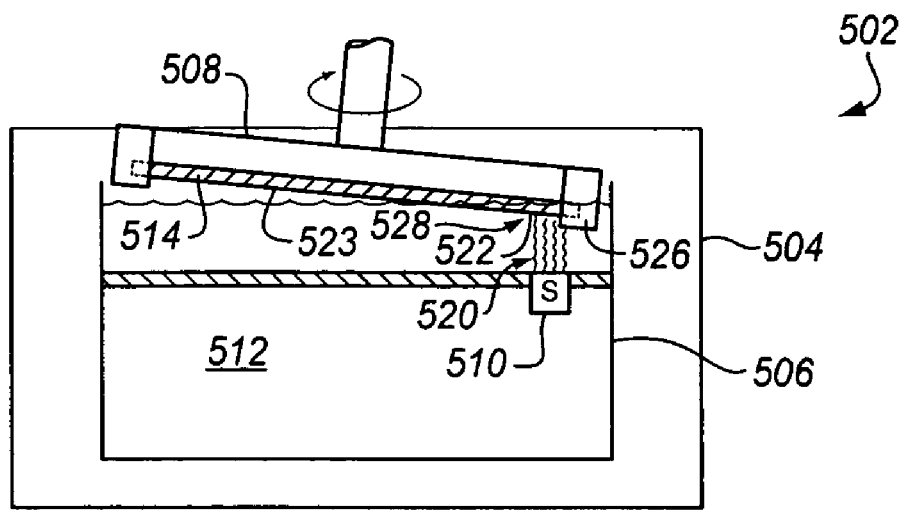

Step 430 includes transporting tilted wafer 514 downward at a piercing speed toward liquid bath 512. Step 440 includes rotating wafer 514, as indicated in FIG. 19 by circular arrow 516. Step 450 includes applying sonic radiation 520 directed substantially normal to leading outer wafer edge region 522 of wafer surface 523 as leading lower outer holder edge 526 and leading outer edge region 522 pierce liquid bath surface 513, as depicted in FIG. 20. In some preferred embodiments, step 450 includes applying sonic radiation 520 directed substantially normal to leading outer wafer edge region 522. In some embodiments, step 450 includes applying sonic radiation 520 at an angle less than perpendicular to outer wafer edge region 522. In some embodiments, step 450 includes applying sonic radiation 520 at an angle substantially normal (perpendicular) to the seam formed between outer wafer edge region 522 and lower outer holder edge 526. It is not usually critical in which order steps 430, 440 and 450 are initiated. In preferred embodiments, however, it is important that the wafer be tilted and rotating as its leading outer edge pierces the liquid bath surface, and that sonic radiation is being applied in the liquid bath as the wafer's leading outer edge pierces the liquid bath surface. Accordingly, in preferred embodiments, wafer 514 is tilted and rotating and sonic radiation 520 is being applied to leading outer wafer edge region 522 as leading outer wafer edge region 522 first enters (pierces) liquid bath surface 513. In some embodiments, either one of wafer rotation (step 440) and sonic irradiation (step 450) or both are initiated contemporaneously with or within a short time (e.g., one second) after initial piercing of liquid bath surface 513 by leading outer edge region 522. In some preferred embodiments, however, rotating of wafer 514 is initiated when wafer holder 508 and wafer 514 are still in the entry position shown in FIG. 18, and sonic irradiation using sonic transducer 510 is started before downward vertical movement of wafer 514 towards liquid bath 512 is initiated. The rotational speed of wafer 514 is typically in a range of about from 12 rpm to 150 rpm, preferably about 90 rpm. Wafer rotation is continued until wafer 514 is completely immersed in liquid bath 512. The vertically downward speed of wafer holder 508 and wafer 514, along the Z-axis, is generally in a range of about from 12 mm per second to 200 mm per second, preferably about 100 mm per second. The downward movement is characterized by an acceleration and deceleration in a range of about from 0.05 G to 0.50 G, where G is earth's gravity 9.8 m/s$^2$ (meters per second squared). It is important to control acceleration and deceleration to maintain consistency of piercing speed among fabrication runs of numerous wafers. An acceleration that is too low would result in variable Z-axial piercing speeds between plating cells and fabrication runs. In some embodiments, sonic irradiation is discontinued shortly (e.g., with 2 seconds) after the wafer is fully immersed in the liquid bath. In some embodiments, sonic irradiation is continued longer (e.g., 5-10 seconds after complete immersion), and in some embodiments, sonic irradiation is continued (uninterrupted or with interruptions) for the whole time that the wafer is immersed in the liquid bath.

In some embodiments, a sonic transducer 510 is used to generate ultrasonic energy having a frequency in a range of about from 20 kHz to 150 kHz and to direct the sonic radiation towards a wafer portion 528 of wafer surface 523 that includes leading outer edge region 522. In some embodiments, a sonic transducer 510 is used to generate high ultrasonic energy having a frequency in a range of about from 150 kHz to 800 kHz and direct it towards a wafer portion 528 of wafer surface 523. In some embodiments, a sonic transducer 510 is used to generate megasonic energy having a frequency greater than about 800 kHz and to direct it towards a wafer portion 528 of wafer surface 523. For example, in some preferred embodiments, a sonic transducer generates megasonic energy having a frequency in a range of about from 0.8 MHz to 3 MHz. In some embodiments, sonic energy generated near or in megasonic ranges about 800 kHz) is preferred because of some desirable characteristics of megasonic energy. Megasonic energy, having shorter wavelengths than ultrasonic and high ultrasonic energy, is more directional in the liquid bath than longer-wavelength energy. As a result, the megasonic energy transmitted from the radiating surface of a megasonic transducer can be focused more effectively than ultrasonic and high ultrasonic energy. Thus, in some embodiments (but not all embodiments) sonic energy is focused to a particular area on the substrate that is less than the total area of the substrate surface. As a result, the total amount of power and sonic energy can be minimized, thereby minimizing the possibility of wafer surface damage induced by violent cavitation. Also, the short-wavelength megasonic energy focused on a particular portion of a wafer surface significantly reduces the boundary layer at the surface and, thereby, effectively removes bubbles having a diameter of 0.5 micrometer ($\mu$m) or less. In some embodiments, the area of focus faces (i.e., is substantially parallel with) the radiating surface of a transducer. In some embodiments, applying sonic radiation to a wafer portion in step 450 comprises applying sonic radiation using a transducer power corresponding to a power density in a range of about from 0.05 Watts per squared centimeter ($W/cm^2$) to 3.0 $W/cm^2$ of total wafer surface area. In some embodiments, applying sonic radiation to a wafer portion in step 450 comprises applying sonic radiation using a transducer power corresponding to a power density in a range of about from 0.1 Watts per squared centimeter ($W/cm^2$) to 1.0 $W/cm^2$ of total wafer surface area. In some embodiments, applying sonic radiation to a wafer portion in step 450 comprises applying sonic radiation using a transducer power corresponding to a power density in a range of about from 0.2 Watts per squared centimeter ($W/cm^2$) to 0.5 $W/cm^2$ of total wafer surface area.

Generally, the downward vertical trajectory of wafer 514 is continued uninterrupted from the moment of initial piercing of liquid bath surface 513 by leading lower outer holder edge 526 until wafer 514 is fully immersed in liquid bath 512. In some embodiments, however, a slight pause in downward movement is utilized immediately upon initial piercing of liquid bath surface 513 by leading holder edge 526. United States Patent Application Publication No. 2008/0149489, published Jun. 26, 2008, by Varadarajan et al., having the title "Multistep Immersion of Wafer into Liquid Bath", which is hereby incorporated by reference, teaches a short pause time during the wafer immersion process to avoid bubble formation on the wafer surface. Even when a pause is utilized in embodiments of the present invention, sonic irradiation generally continues.

Figure 21:
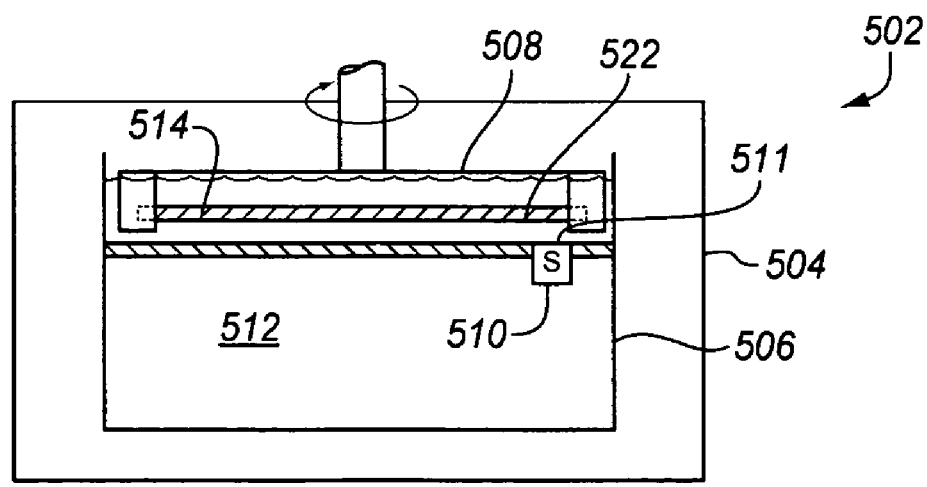

Step 460 includes continuing downward vertical movement of wafer 514 down to a treatment position, as depicted in FIG. 21. In some embodiments, as depicted in FIG. 21, wafer 514 is re-positioned into a horizontal orientation. In some embodiments (not depicted), wafer 514 remains tilted at the same angle it had during immersion, or it is moved to a different non-horizontal angle. U.S. Pat. No. 6,551,487, issued Apr. 22, 2003 to Reid et al., which is incorporated by reference, teaches that a short delay time interposed between arrival of wafer 514 at the treatment position in an angled position and the re-orienting of wafer 514 to a different angle or to a horizontal position is beneficial in reducing some pit defects. In some embodiments, re-orienting of wafer 514 is conducted using a "swing speed" (i.e., the speed at which wafer holder 508 and wafer 514 change angles) in a range of about from 12 mm per second to 125 mm per second, preferably about 50 mm per second.

In some embodiments, when wafer 514 is located in its treatment position (FIG. 21), lower wafer edge region 522 is separated from radiating surface 511 of sonic transducer 510 by a gap having a vertical gap width in a range of about from 3 mm to 8 mm, preferably about 4 mm. in some embodiments in which the wafer has been re-oriented to a horizontal position, the plane corresponding to wafer surface 523 is separated from the horizontal plane corresponding to radiating surface at 511 by a gap having a vertical gap width in a range of about from 3 mm to 8 mm, preferably about 4 mm.

In embodiments in accordance with the invention, sonic irradiation generally is continued until wafer 514 is completely immersed in liquid bath 512. In some embodiments, sonic irradiation is terminated after wafer surface 523 has been completely immersed and wetted in liquid bath 512. In some embodiments, sonic irradiation is continued for a limited amount of time (e.g., 4 seconds) after immersion has been completed. In some embodiments, sonic irradiation is continued during the entire liquid treatment of wafer surface 523 in liquid treatment bath 512. In some embodiments, after wafer surface 523 has been completely immersed and wetted in liquid bath 512, sonic irradiation is applied intermittently; for example, activations of sonic radiation for durations in a range of about from 0.01 seconds to 10 seconds alternating with off-times in a range of 0.1 seconds to 60 seconds.

It is a feature of embodiments in accordance with the invention that cavitation is avoided by minimizing the total power of total sonic radiation applied to a wafer surface. In some embodiments in accordance with the invention, liquid treatment bath 512 is de-gassed before and/or during liquid treatment to reduce the amount of dissolved gases in liquid bath 512 and thereby to reduce the propensity for bubble formation in the liquid bath.

Figure 22:
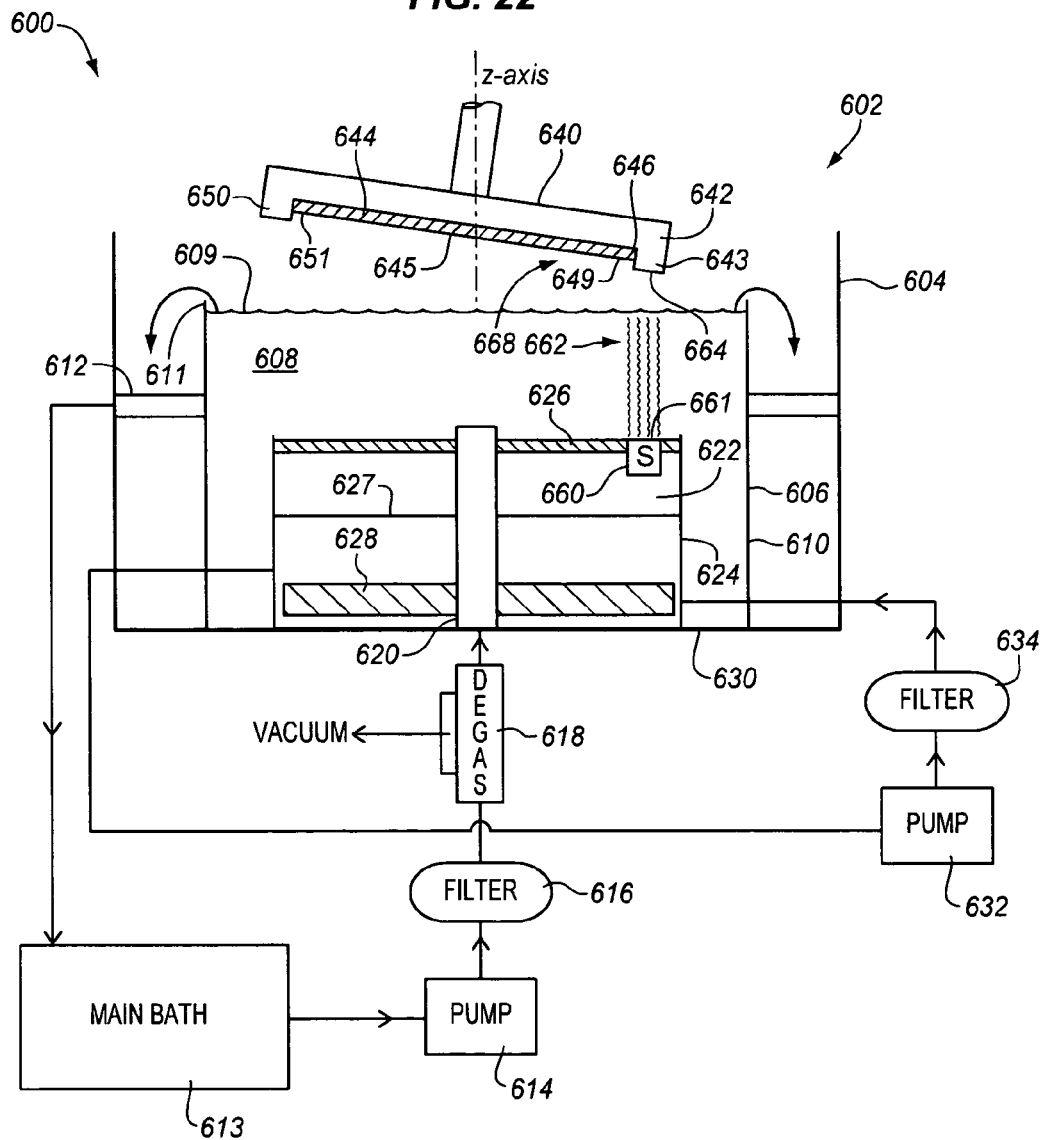
FIG. 22 depicts schematically a cross-sectional view of a generalized liquid treatment system in accordance with the invention operable for electroplating metal onto a semiconductor wafer.
Figure 23:
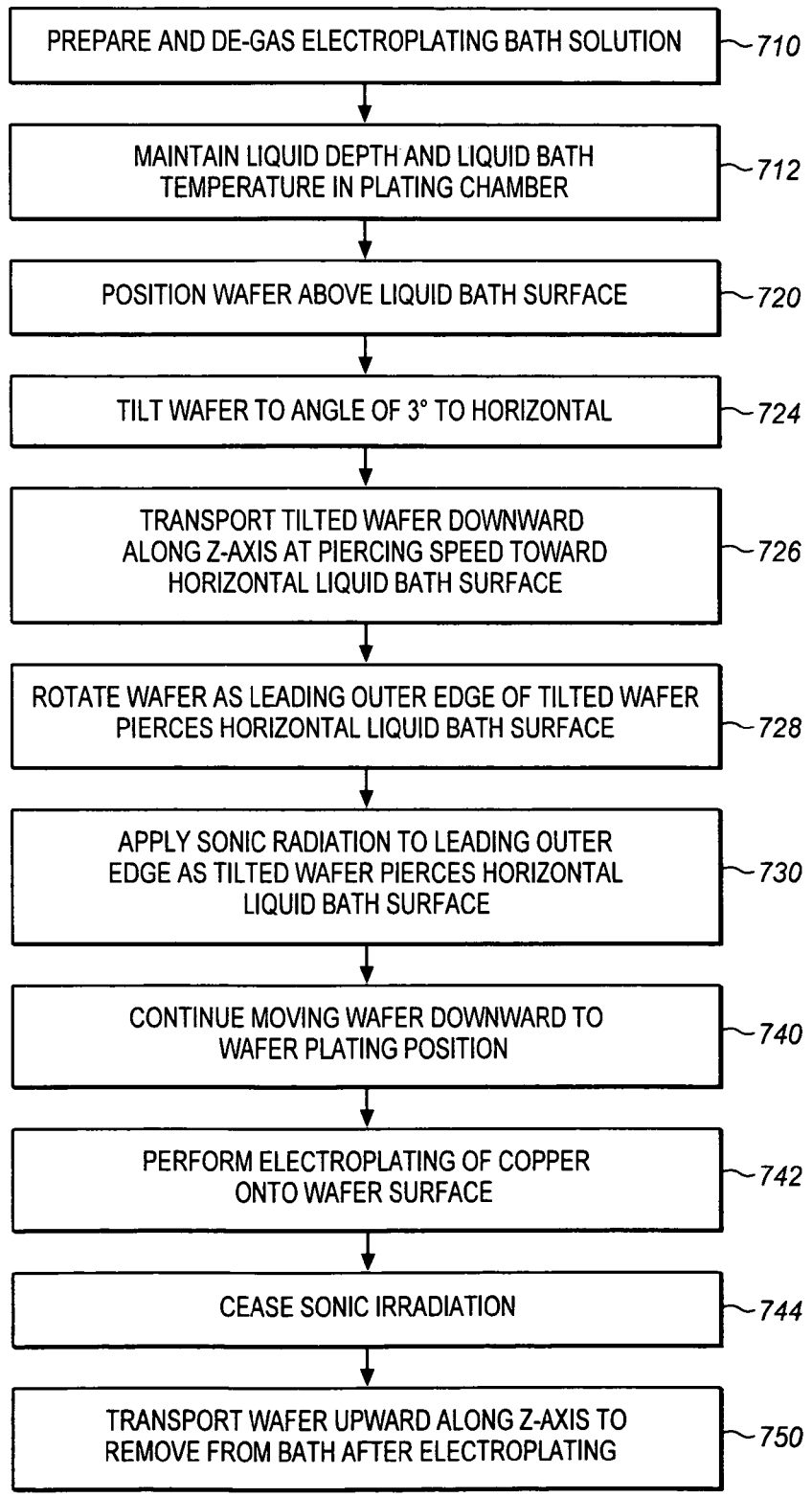
FIG. 23 contains a process flow sheet of a generalized method in accordance with the invention for sonic irradiation of a wafer during immersion of the wafer into an electroplating bath and subsequent electroplating of copper on the wafer.

FIG. 22 depicts schematically a cross-sectional view 600 of a generalized liquid treatment system 602 in accordance with the invention operable for electroplating (electrolytic plating) metal onto a semiconductor wafer. System 602 comprises an electroplating cell 604 that includes a plating chamber 606. Plating chamber 606 is operable to hold electroplating bath 608 that is utilized for metal plating of a semiconductor wafer. Electroplating bath 608 has a top liquid surface 609. Plating chamber 606 includes chamber sidewall 610 and overflow weir 611. System 602 further comprises bath overflow collection trough 612. System 602 further includes main bath 613, which serves as a source of electroplating solution and which is operable to receive overflow liquid from collection trough 612. System 602 further includes bath inlet pump 614, bath inlet filter 616, and inlet liquid degassing unit 618. Degassing unit 618 is operable to de-gas electroplating liquid from main bath 612 before it enters plating chamber 606 through chamber inlet conduit 620. System 602 further comprises an anode chamber 622 having anode chamber walls 624, flow distribution element 626, anode membrane 627 and anode 628. In some embodiments of system 602, flow distribution element 626 functions as a high resistance virtual anode (HRVA). Anode 628 is disposed at the bottom of anode chamber 622. Anode membrane 627 is substantially resistive to flow and serves to separate anolyte and catholyte streams. As depicted in FIG. 22, anode chamber 622 is defined substantially by anode chamber walls 624, flow distribution element 626, and the bottom 630 of plating chamber 606. U.S. Pat. No. 6,964,792, issued Nov. 15, 2005, to Mayer et al., U.S. Pat. No. 6,402,923, issued Jun. 11, 2002, to Mayer et al., and U.S. Pat. No. 7,070,686, issued Jul. 4, 2006, to Mayer et al., teach systems and methods suitable for adaptation to embodiments in accordance with the invention. System 602 further comprises bath recirculation pump 632 and bath recirculation filter 634 operable to recirculate and filter liquid plating solution. System 602 further comprises wafer holder 640 having outer holder edge 642. Wafer holder 640 is operable to hold a semiconductor wafer 644, which has wafer surface 645 and outer edge region 646. Typically, wafer holder 640 is designed to clamp and to enclose the outer edge (not shown) of wafer 644. Wafer holder 640 is operable to transport wafer 644 vertically along the Z-axis depicted in FIG. 22. Wafer holder 640 is further operable to tilt wafer 644 about its Z-axis and to move and hold wafer 644 in such a position that it forms an angle to the horizontal X-Y plane of liquid surface 609. Wafer holder 640 and wafer 644 are depicted in FIG. 22 in a tilted (or angled) entry position, so that the plane defined by wafer surface 645 makes an angle (typically within in a range of about 1° to 6°) to top liquid surface 609 of liquid bath 608. In this specification, the portion of tilted outer holder edge 642 closest to liquid bath 608 is referred to as leading lower outer holder edge 643, and the portion of tilted wafer surface 645 closest to liquid bath 608 is referred to as leading outer edge region 649. The portion of tilted outer holder edge 642 farthest from liquid bath 608 is referred to as trailing lower outer holder edge 650, and the portion of tilted wafer surface 645 farthest from liquid bath 608 is referred to as trailing outer edge region 651. Wafer holder 640 is further operable to rotate wafer 644 while transporting wafer 644 downward into liquid bath 608. System 242 further comprises a power supply (not shown) operable to provide electroplating current by connecting to anode 628 and to the outer edge of wafer 644 through wafer holder 640.

In accordance with the invention, system 602 further includes sonic transducer 660 having radiating surface 661. As depicted in FIG. 22, radiating surface 661 of sonic transducer 660 is surrounded by flow distribution element 626 in plating chamber 606 above anode 628. In system 602, radiating surface 661 is substantially flush with the top surface of flow distribution element 626. Sonic transducer 660 is operable to direct sonic radiation 662 upwards through electroplating bath 608 to a wafer portion 668 of planar wafer surface 645 of wafer 644 while tilted wafer 644 is being immersed at an angle into electroplating bath 608 and as the leading outer edge 643 and leading outer edge region 649 pierce liquid surface 609. In some embodiments, sonic transducer 660 is operable to direct sonic radiation 662 upwards through electroplating bath 608 substantially normal to wafer portion 668. The wafer portion 668 at which sonic radiation 662 is directed is substantially less than the total surface area of wafer surface 645 and the portion includes at least part of leading outer edge region 649 of wafer surface 645. As explained above, with reference to systems 202 242 and 282, in some embodiments, sonic energy is not directed substantially normal to wafer surface 645; instead, the sonic energy travels in waves that, at least to some extent, form an angle or angles to wafer surface 645 substantially less than 90°. Also, some embodiments in accordance with the invention include a plurality of sonic transducers or a plurality of radiating surfaces. An example of a sonic transducer suitable for use in accordance with the invention is a model MEGPIE™ transducer, commercially available from ProSys (Product Systems, Inc.), Campbell, Calif.

FIG. 23 contains a process flow sheet of a generalized method 700 in accordance with the invention for sonic irradiation of a wafer during immersion of the wafer into an electroplating bath and subsequent electroplating of copper on the wafer. Method 700 is described herein with reference to FIGS. 17-22. It is understood, however, that some methods in accordance with the invention are practiced utilizing systems different from those depicted in FIGS. 17-22, and that in some methods in accordance with the invention, some of the steps in the process flow sheet of FIG. 23 are conducted in a different sequence. An exemplary system that is adaptable for use in accordance with the invention is a model SABRE® plating tool, commercially available from Novellus Systems, Inc., San Jose, Calif.

Step 710 includes preparing an electroplating solution, filling the electroplating solution into main bath 612, and pumping the electroplating solution into plating chamber 606. Exemplary electroplating solutions for plating copper typically comprise: copper ions, a dissociated acid, and chloride ions; and usually one or more additives, such as an accelerator, a suppressor, and a leveler. The concentrations of the various components in an electroplating solution are selected to achieve desired plating characteristics, that is, a relatively fast feature fill rate, minimal overplating and optimal film purity. A representative electrolytic plating solution includes: copper in a range of about from 5 grams per liter (g/L) to 65 g/L; sulfuric acid in a range of about from 10 g/L to 175 g/L; HCl in a range of about from 30 milligrams per liter (mg/L) to 70 mg/L; and additives comprising accelerator molecules, suppressor molecules, and leveler molecules. An exemplary accelerator comprises, but is not limited to, bis(3-sulfopropyl)disulfide, typically at a concentration in a range of about from 0.5 ppm to 30 ppm, and more typically in a range of about from 8 ppm to 28 ppm. Exemplary suppressors include, but are not limited to, poly(ethylene glycol) having a molecular weigh in a range of about from 100 to 40,000, and poly(propylene glycol) having a molecular weight in a range of about from 400 to 5000. Suppressor molecules generally are present in a concentration range of about from 50 ppm to 2000 ppm, more typically in a range of about from 100 ppm to 400 ppm. Exemplary leveler molecules comprise, but are not limited to, Janus Green B, polyvinylpyrrolidone, and poly(vinylpolypyrrolidone), generally in a concentration range of about from 0.01 ppm to 30 ppm, more typically in a range of about from 0.5 ppm to 1 ppm. U.S. Pat. No. 7,232,513, issued Jun. 19, 2007, to Webb et al., which is hereby incorporated by reference, teaches an electroplating bath containing a wetting agent for defect reduction.

Preferred embodiments further include degassing of the electroplating solution before immersion of the wafer in accordance with the invention into the plating bath and during electroplating. The concentration of dissolved oxygen in air-saturated electroplating solutions has been measured to be about nine (9) parts per million (ppm) at 25° C. Degassing unit 618 in system 602 depicted in FIG. 22 draws a partial vacuum on electroplating solution as it flows from main bath 612 into plating chamber 606 and is operable to draw dissolved air and other gases out of the electroplating solution. A conventional degassing unit is operable to reduce the concentration of oxygen, $O_2$, to about 2.0 ppm. Accordingly, in embodiments in accordance with the invention, the concentration of dissolved air in electroplating bath 608 is typically in a range of about from 20% to 100% of saturation levels.

In preferred embodiments, radiating surface 661 is located in electroplating bath 608 at a fixed distance below horizontal bath surface 609 at the point where leading edge 643 and leading wafer edge region 649 begin immersion of wafer 644 into plating bath 608. Accordingly, step 712 includes maintaining a predetermined bath height. In some embodiments, the location of radiating surface 661 and the bath height are controlled so that radiating surface 661 is located at a distance in a range of about from 10 mm to 30 mm below horizontal liquid surface 609, preferably about 20 mm. Step 712 also usually includes maintaining the bath temperature in a range of about from 15° C. to 30° C., preferably about 21° C.

Step 720 includes moving wafer holder 640 and wafer 644 into a wafer entry position located in a range of about from 15 mm to 50 mm above bath surface 609. Step 724 includes tilting wafer holder 640 and wafer 644 so that wafer surface 645 makes an angle of about 3° to horizontal. Step 726 includes transporting tilted wafer holder 640 and tilted wafer 644 downward along the vertical Z-axis at a piercing speed in a range of about from 12 mm per second to 200 mm per second, preferably at about 100 mm per second. Step 728 includes rotating wafer 644 as leading outer edge region 649 pierces plating bath surface 609. The rotational speed of wafer 644 is typically in a range of about from 12 rpm to 150 rpm, preferably about 90 rpm. Generally, wafer rotation is continued at least until wafer 644 is completely immersed in liquid bath 608. Typically, wafer rotation is continued until wafer treatment, such as electroplating, is completed. Step 730 includes applying sonic radiation 662 to a wafer portion of tilted planar wafer surface 645 as leading outer edge region 649 pierces horizontal bath surface 609. In some embodiments, wafer portion 668 is substantially less than the total wafer surface area and wafer portion 668 includes leading outer edge region 649 of planar wafer surface 645. In some embodiments, sonic radiation 662 is directed substantially normal (perpendicular) to at least part of the wafer portion as leading outer edge region 649 pierces bath surface 609.

In some embodiments, a sonic transducer 660 is used to generate ultrasonic energy having a frequency in a range of about from 20 kHz to 150 kHz and direct the sonic radiation towards wafer portion 668 of wafer surface 645. In some embodiments, a sonic transducer 660 is used to generate high ultrasonic energy having a frequency in a range of about from 150 kHz to 800 kHz and direct it towards wafer portion 668 of wafer surface 645. In some embodiments, a sonic transducer 660 is used to generate megasonic energy having a frequency greater than about 800 kHz and direct it towards wafer portion 668 of wafer surface 645. For example, in some preferred embodiments, a sonic transducer generates megasonic energy having a frequency in a range of about from 1 MHz to 3 MHz. In some embodiments, applying sonic radiation 662 to a wafer portion 668 in step 730 comprises applying sonic radiation using a transducer power corresponding to a power density in a range of about from 0.05 W/cm$^2$ to 3.0 W/cm$^2$ of total wafer surface area. In some embodiments, applying sonic radiation 662 to wafer portion 668 in step 730 comprises applying sonic radiation using a transducer power corresponding to a power density in a range of about from 0.1 W/cm$^2$ to 1.0 W/cm$^2$ of total wafer surface area. In some embodiments, applying sonic radiation 662 to wafer portion 668 in step 730 comprises applying sonic radiation using a transducer power corresponding to a power density in a range of about from 0.2 W/cm$^2$ to 0.5 W/cm$^2$ of total wafer surface area.

Step 740 includes continuing the downward vertical movement of wafer 644 to a plating position, as depicted in FIG. 21. In some embodiments, as depicted in FIG. 21, the wafer is re-positioned into a horizontal orientation. In some embodiments (not depicted), the wafer remains tilted at the same angle it had during immersion, or it is moved to a different non-horizontal angle. U.S. Pat. No. 6,551,487, issued Apr. 22, 2003 to Reid et al., which is incorporated by reference, teaches that a short delay time (e.g., in a range of about from 15 seconds to 90 seconds) interposed between arrival of the wafer at the plating position in an angled position and the re-orienting of wafer to a different angle or to a horizontal position is beneficial in reducing some pit defects. Since the wafer is rotating relatively fast, if the wafer is tilted back to horizontal or to another angle too quickly, then too much turbulence may result and create bubbles or splashing (and possibly contamination of equipment with splashed electrolyte). As with all events in a high throughput environment, if the swing speed is too slow, throughput suffers. Preferably, the swing speed of the wafer is in a range of about from 0.25 degrees per second to 3 degrees per second. More preferably, the swing speed is in a range of about from 0.25 to 1.5 degrees per second. Most preferably, the swing speed is in a range of about from 0.5 degrees per second to 1 degree per second. Once the wafer is oriented horizontally, as in FIG. 22, then it is plated in that orientation. If the wafer is to be treated in a tilted orientation, then the treating (e.g., plating) is conducted with the wafer fully-immersed at an angle.

In some embodiments, when wafer 644 is located in its plating position (see FIG. 21), lower wafer edge region 649 is separated from the top surface of flow distribution element 626 and radiating surface 661 of sonic transducer 660 by a gap having a vertical gap width in a range of about from 3 mm to 8 mm, preferably about 4 mm. In some systems in accordance with the invention, the bottom surface 664 of lower outer edge 643 of wafer holder 640 is about 2 mm lower than the plane of wafer surface 645. In such embodiments, when the bottom surface 664 of lower outer edge 643 of wafer holder 640 is separated from the plane of flow distribution element 626 and radiating surface 661 by a gap of 1 mm, for example, then the gap width between a horizontal wafer surface 645 and flow distribution element 626 (and radiating surface 661) is about 3 mm.

Step 742 includes electroplating copper onto wafer surface 645 using techniques known in the art.

In embodiments in accordance with the invention, sonic irradiation generally is continued until wafer surface 645 is completely immersed in liquid bath 608. In some embodiments, sonic irradiation is continued during the whole time the wafer is in the bath and is terminated only after the wafer is completely removed from the liquid bath after electroplating (or other liquid treatment). In some embodiments, sonic irradiation is terminated in optional step 744 after electroplating (or other liquid treatment) has been completed. In some embodiments, sonic irradiation is terminated shortly after (e.g., within 2 seconds) wafer surface 645 has been completely immersed and wetted in liquid bath 608. In some embodiments, sonic irradiation is continued for a limited amount of time after immersion and then interrupted or terminated. For example, when the immersion process requires about one second until the wafer is in its plating position and sonic irradiation continues for four seconds after plating current initiates, then the total sonic irradiation time is about five seconds. Typically, sonic irradiation is continued during the entire electroplating of wafer surface 645 in electroplating bath 608. In some embodiments, after wafer surface 645 has been completely immersed and wetted in liquid bath 608, sonic radiation is applied intermittently; for example, activations of sonic radiation for durations in a range of about from 0.01 seconds to 10 seconds alternating with off-times in a range of about from 0.1 seconds to 60 seconds.

After electroplating has been completed, wafer 644 is transported in step 750 vertically upwards along the Z-axis and removed from electroplating bath 608.

It is a feature of embodiments in accordance with the invention that cavitation is avoided during sonic irradiation of a wafer 644. In some embodiments in accordance with the invention, as explained above, electroplating bath 608 is degassed before and/or during electroplating to reduce the amount of dissolved gases in liquid bath 608 and thereby to reduce the propensity for bubble formation.

Obviously, an apparatus in accordance with the invention permits the full range of operations associated with electroplating or other liquid bath treatment. Thus, for example, the apparatus permits and/or drives movement of the wafer into and out of a liquid bath. Preferably, though not necessarily, this is accomplished along a linear trajectory, that is, along a path substantially normal to the surface of the electrolyte. In addition, the apparatus allows and/or drives rotation of the wafer about an axis through the center of a wafer's active planar surface. Parameters that are controllable and variable in an apparatus in accordance with the invention include, among others: the speeds at which the wafer is rotated; the swing speed at which the wafer is tilted over a range of angles; the total range of angles over which the wafer's planar surface is tilted; the speed at which a holder-wafer combination is translated into and out of the electrolyte; the pause locations at which downward and upward movement of a holder-wafer combination is stopped and started; and the rates of acceleration and deceleration of movement at one or more pause locations.

An apparatus suitable for use with this invention can take on many different forms. It may include a variety of drive mechanisms, holders, pivot devices, and structural members. Generally, there is a drive mechanism for controlling the rotation of the wafer. There are one or one or more other drive mechanisms that control tilting of the wafer and translation of the wafer. Suitable drive mechanisms include many different types, such as hydraulic actuators, electric motors, screw drives, and the like. Various wafer holders and tracks for moving the wafer holders may also be employed.

In some embodiments, wafer tilting is accomplished by an apparatus that holds the wafer at a proximate end of a longitudinal member. The apparatus maintains this end of the longitudinal member at a substantially constant position in three-dimensional Cartesian space. The distal end of the longitudinal member is allowed to move over an arcuate path. This causes the wafer to tilt as described above. As described in U.S. Pat. No. 6,551,487, which is incorporated by reference, the longitudinal member may take the form of a wafer holder in an "inverted pendulum" orientation.

Example 1

Figure 24:
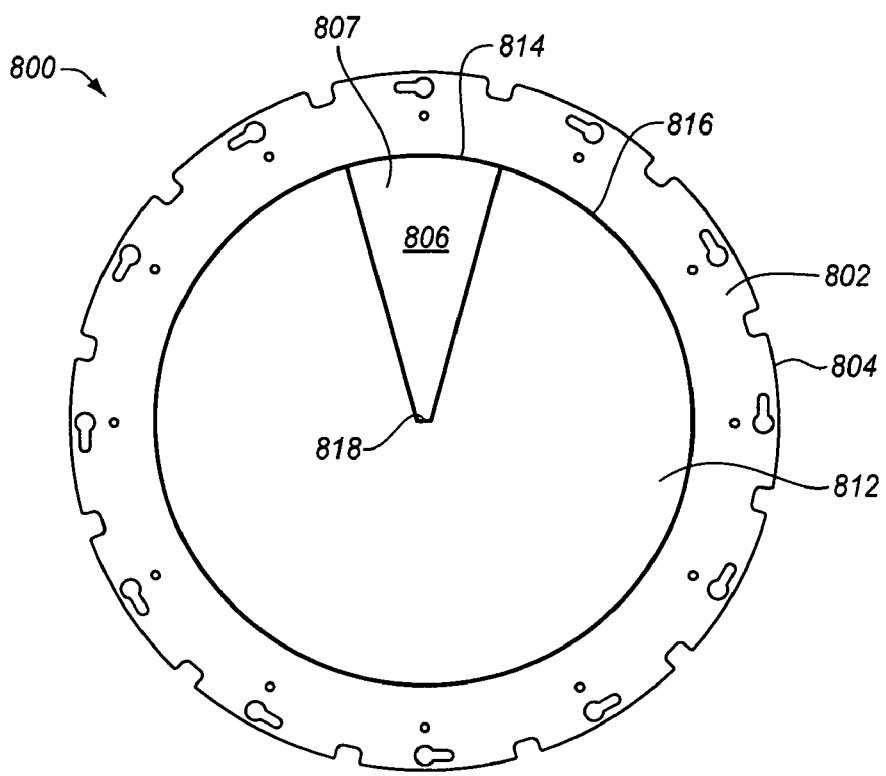
FIG. 24 depicts schematically a view looking downward at the top surface of a high resistance virtual anode (HRVA) and a megasonic transducer.
Figure 25:
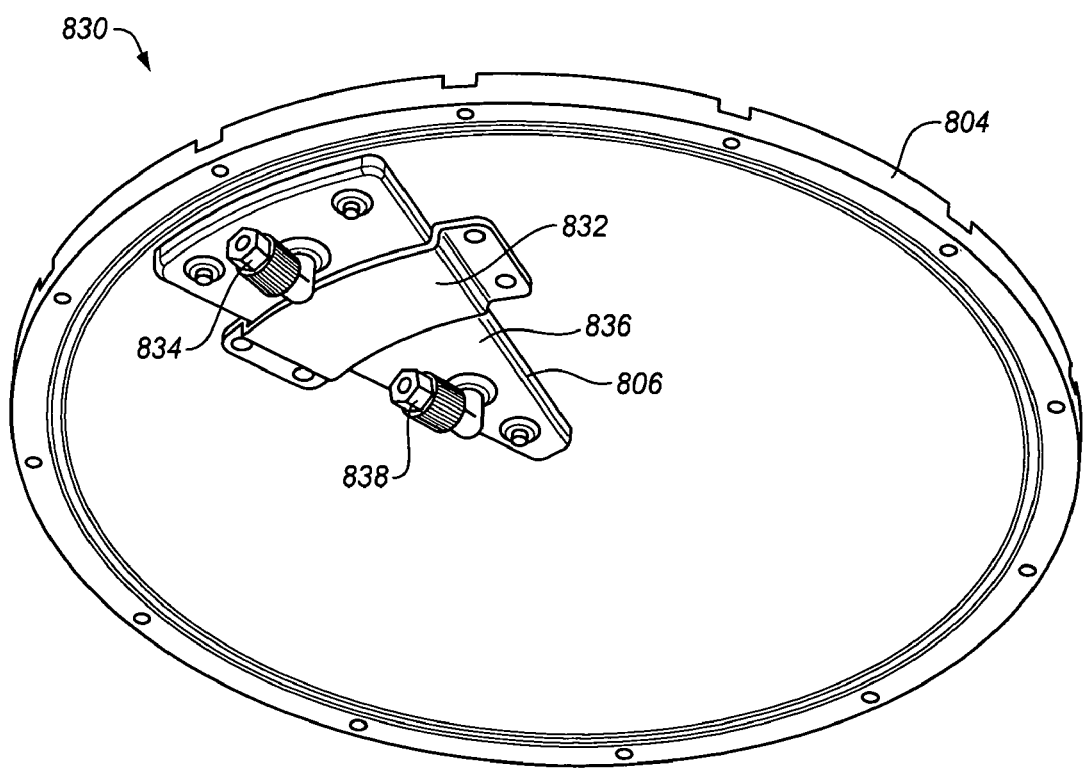
FIG. 25 depicts a bottom view of the HRVA plate and the megasonic transducer of FIG. 24.
Figure 26:
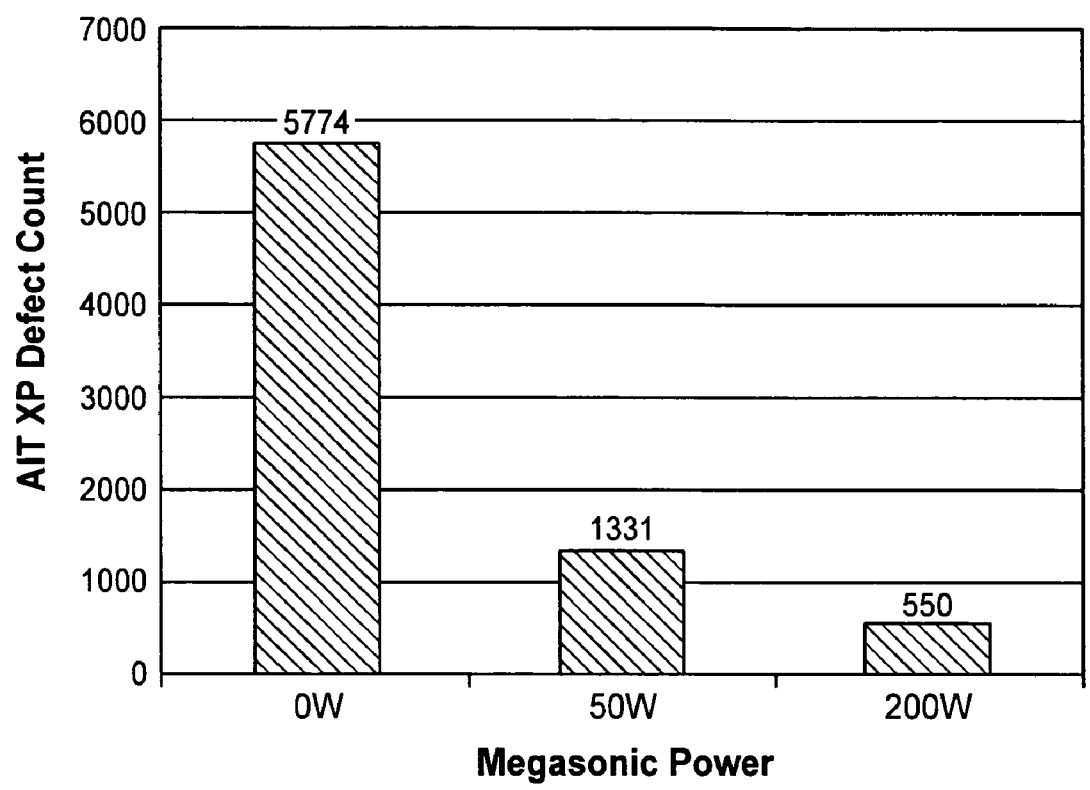
FIG. 26 contains a chart that shows the number of defects counted in wafers subjected to different megasonic power levels.

A standard HRVA (high resistance virtual anode) plate (e.g., see flow distribution element 626 depicted in FIG. 22) was modified by cutting out a section to accommodate a wedge-shaped megasonic transducer. The standard HRVA plate is commercially available from Novellus Systems, Inc. The standard HRVA plate is a standard element in the model SABRE Extreme® electroplating system commercially available from Novellus Systems, Inc. The standard HRVA plate consists essentially of PPE material, has a diameter of approximately 400 mm (for treatment of a 300 mm wafer), and has a thickness of approximately 12 mm. The HRVA plate was modified to accommodate a model MEGPIE™ ProSys transducer, which is substantially wedge-shaped and has a central arc angle of approximately 30°. FIG. 24 depicts schematically a view 800 looking downward at the top surface 802 of HRVA plate 804. Megasonic transducer 806 is secured in the cutout section of HRVA plate 804. In this particular embodiment, the top surface 807 of megasonic transducer 806 is recessed approximately 1 mm from the top surface 802 of HRVA plate 804. Top radiating surface 807 of MEGPIE™ megasonic transducer 806 is substantially flat. View 800 also depicts the superimposed footprint 810 of a 300 mm wafer (e.g., wafer 514 in FIG. 21) to show the relative spatial orientations of HRVA plate 804, megasonic transducer 806 and a 300 mm wafer above. As depicted in view 800 of FIG. 24, in this particular embodiment, the outer peripheral edge 814 of transducer 806 is substantially vertically aligned with outer peripheral edge 816 of the wafer above. During operation in accordance with the invention, top flat radiating surface 807 of megasonic transducer 806 is substantially parallel to the 300 mm wafer above. Since the center 818 of the wedge-shaped transducer 806 is aligned substantially with the center of the 300 mm wafer above, approximately one-third of the surface area of flat, exposed radiating surface 807 is vertically aligned with the outer edge region of the wafer above defined as the region between 0.8R and 1.0R on the wafer. FIG. 25 depicts a bottom view 830 of HRVA plate 804 and megasonic transducer 806. The megasonic transducer is fastened into HRVA plate 804 using clamp 832. A specially designed gasket (not shown) seals the seating of megasonic transducer 806 in HRVA plate 804. Megasonic transducer 804 includes a connector 834 at transducer bottom 836 for connecting a RF generator cable. Megasonic transducer 804 also includes a connector 838 for connecting a CDA (clean dry air) purge line.

MEGPIE™ megasonic transducer 806 is rated for 925 kHz frequency and a power of 0 Watts (W) to 200 W.

Example 2

Semiconductor wafers were immersed in accordance with the invention into a liquid electroplating bath. Megasonic radiation was applied as each tilted wafer entered the liquid bath. Copper was electroplated onto the wafers. The wafers were then examined for defects to determine the effects of immersion and sonic irradiation in accordance with the invention.

A Novellus Model SABRE Extreme® apparatus equipped with a clamshell-type wafer holder was used to electroplate copper on integrated circuit substrate wafers using a typical electroplating solution. Process specifications of a standard SABRE Extreme® copper DC electrofill process are known in the art.

The HRVA plate in the electroplating apparatus was modified to accommodate a MEGPIE™ megasonic transducer, as described in Example 1 above. The RF power supply for the megasonic transducer was operable to provide power having a pulse rate in a range of from 1.0 milliseconds (ms) to 60,000 seconds, and was operable to provide a duty cycle in a range of from 0% to 100%. The flat radiating surface of the megasonic transducer was parallel to the horizontal liquid surface of the electroplating bath.

Copper was electroplated on each of three pre-treated 300 mm silicon wafers having a PVD copper seed layer with a thickness of approximately 60 nm. The seeded wafers were pre-treated by ultraviolet (UV) baking for five days, as known in the art, in order to ensure "difficult to wet" seed conditions that accentuate entry defects.

The electroplating solution contained: 40 grams per liter (g/l) of dissolved copper metal, added as copper sulfate pentahydrate ($CuSO_4.5H_2O$); 10 g/l $H_2SO_4$; 50 milligram per liter (mg/l) chloride ion, added as HCl; 3 milliliter per liter (ml/l) eMat accelerator; 16.5 ml/l eMat leveler; and 5 ml/l eMat suppressor. The liquid plating bath had a volume of approximately 150 liters.

Copper plating was conducted at a bath temperature of about 25° C. The plating solution was pumped into the liquid bath at a volumetric flow rate of about 6 liters per minute. The distance between the cathodic plating surface of the wafer and the top surface of the HRVA was about 3 mm.

The operating conditions used for immersion, megasonic irradiation and electroplating of each of the three wafers were identical except that power applied to the megasonic transducer differed between the wafers. The megasonic power was turned on during the whole process, that is, from the time that a wafer initially pierced the surface of the liquid electroplating solution until it was removed from the electroplating bath after electroplating was completed, for a total of about 70 seconds. During processing of the first, control wafer, 0 W power was applied. During processing of the second wafer, 50 W power was applied. During processing of the third wafer, 200 W power was applied. In accordance with the invention, each wafer was tilted at an angle of 3° to the plane of the horizontal liquid electroplating bath surface. Each wafer was moved downward from an entry position about 15 mm above the horizontal liquid surface toward the horizontal liquid surface at an entry speed of 100 mm per second. Each wafer was rotating at a speed of 30 rpm as its leading outer edge region pierced the horizontal liquid surface of the electroplating bath. An entry condition of 100 mm per second downward (Z-direction) speed and 30 rpm is known to result in edge defects ("comets") at the leading edge of the wafer.

The depth of the electroplating bath above the radiating surface of the megasonic transducer (i.e., the distance between the top liquid surface of the electroplating bath and the flat radiating surface parallel to the top liquid surface) was about 20 mm. Using the MEGPIE™ megasonic transducer, sonic radiation of 925 kHz frequency, 2 millisecond pulse length and 100% duty cycle was applied in accordance with the invention to the leading outer edge region of the second and third wafers at 50 W and 200 W, respectively, as the leading outer edge of the wafer pierced the liquid bath surface. The sonic radiation was applied in each case during the whole process from no later than the initial piercing of the electroplating bath by the wafer until removal of the wafer after electroplating, for a total time of about 70 seconds. Since a 100% duty cycle was used, the power was applied essentially uninterrupted.

After complete immersion of a wafer into the electroplating bath, it was moved downward to about 3 mm above the HRVA plate, which corresponds to about 4 mm above the flat radiating surface of the megasonic transducer.

Figure 27:
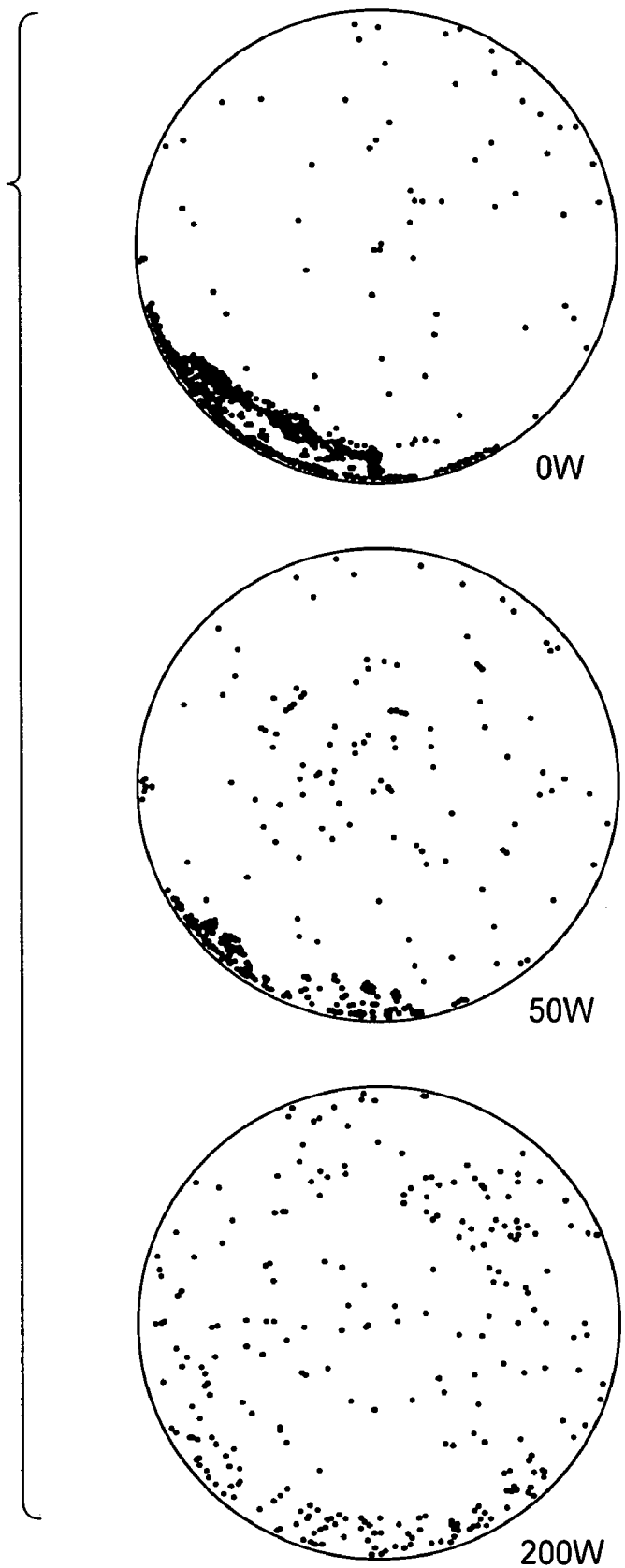
FIG. 27 depicts schematically the defects observed on the three wafers subjected to different megasonic power levels.

After electroplating, the three wafers were examined. The results of counting defects by standard techniques are presented in the chart contained in FIG. 26. The control wafer, for which no sonic radiation was applied, contained 5774 defects. The second wafer, for which 50 W power was applied to the megasonic transducer, had 1331 defects. The third wafer, for which 200 W power was applied, had only 550 defects. FIG. 27 depicts schematically the results of the examinations of the three wafers. The large number of defects at the lower edge of the wafer to which no power was applied is a signature pattern of defects typically caused at the leading edge of a wafer as a result of immersion and electroplating in the prior art. The defect signature pattern was significantly reduced on the wafer for which 50 W power was applied to the transducer, and the signature pattern is almost eliminated on the wafer to which 200 W power was applied.

Example 3

The effects of wafer immersion and sonic irradiation in accordance with the invention were studied using parameters and operating conditions similar to those described in Example 2 above, but with some changes that are described here.

The effects were studied on three different types of silicon wafers. The first type of wafer had a 60 nm copper seed and was pretreated by UV baking for five weeks. The second type had a 40 nm copper seed and was pretreated with 10 mL 5% sulfuric acid. The third type of wafer had a 40 nm copper seed and no pretreatment, and it served as a defect monitor. As above, the rationale for using pretreated wafers was to introduce a "difficult to wet" seed condition that accentuated entry defects.

The electroplating solution contained additives from a different supplier than in Example 2 and contained: 40 grams per liter (g/l) of dissolved copper metal, added as copper sulfate pentahydrate ($CuSO_4.5H_2O$); 10 g/l $H_2SO_4$; 50 milligram per liter (mg/l) chloride ion, added as HCl; 6 milliliter per liter (ml/l) VIAFORM® Extreme accelerator; 3.0 ml/l VIAFORM® Extreme leveler; and 2 ml/l VIAFORM® suppressor. The liquid plating bath had a volume of approximately 150 liters.

Immersion and electroplating of the wafers was conducted at zero power and at 200 W power during the whole process time of about 70 seconds, at 100% duty cycle and 2 ms nominal pulse.

Of the first type of wafer having a 60 nm copper seed and pretreated by UV baking, two wafers were processed using 0 W power and two were processed using 200 W power. A large number of defects and a signature pattern of leading edge defects were observed on the two wafers processed without sonic radiation (0 W), similar to the signature pattern described in Example 2 with reference to FIG. 27. The two wafers processed with sonic radiation at 200 W had a significant number of defects, but displayed a less prominent signature pattern of leading edge defects than the wafers without power.

Of the second type of wafer having 40 nm copper seed and pretreated with sulfuric acid, two wafers were processed using 0 W power and two were processed using 200 W power. Some defects (but fewer than on the first type of wafer) and a signature pattern of leading edge defects (but less prominent than on the first type of wafer) were observed on the two wafers processed without sonic radiation (0 W). The two wafers processed with sonic radiation at 200 W had a comparable number of defects, but displayed a less prominent signature pattern of leading edge defects than the wafers without power.

As expected, a relatively small number of defects and no leading edge signature patterns were observed on the "defect monitor" wafers, with or without sonic radiation applied. Importantly, no detrimental effects of sonic radiation in accordance with the invention were detected on the "defect monitor" wafer for which sonic radiation was applied.

Thus, as in Example 2 above, the application of sonic radiation in accordance with the invention nearly eliminated the defect signature at the leading edge of "difficult to wet" copper-seeded wafers.

Example 4

The effects of different activation ("ON") times, pulse lengths and duty cycles on defect formation were studied. Immersion and electroplating were conducted under conditions similar to those described in Example 3 above. Only one type of silicon wafer was used, each wafer having a 60 nm copper seed and pretreated by UV baking for five weeks. As in Examples 2 and 3, the entry condition used uniformly was 100 mm per second downward Z-direction speed and 30 rpm.

Figure 28:
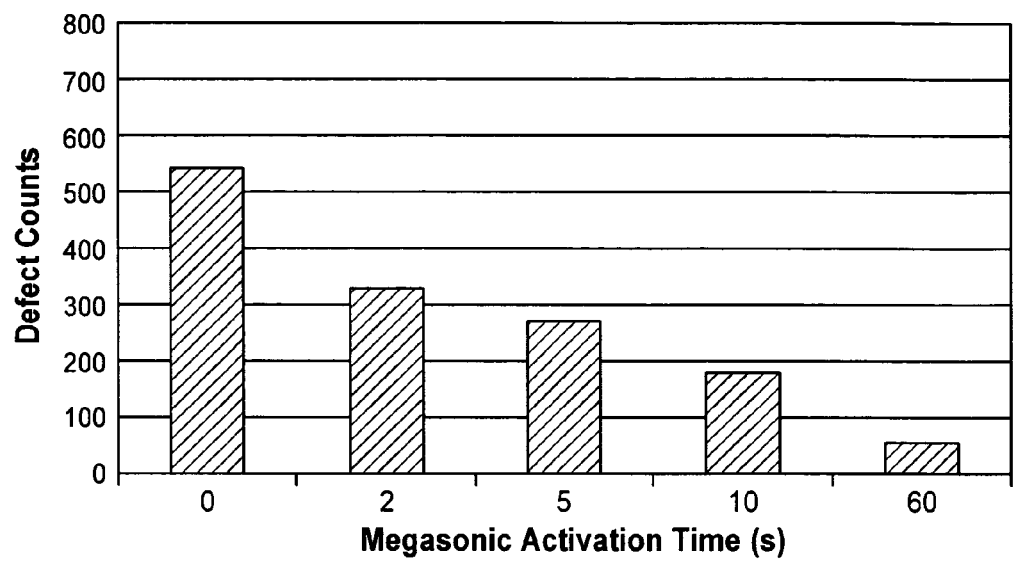
FIG. 28 contains a chart showing defect counts on wafers processed with different megasonic activation times.

Five wafers of a first set of wafers were immersed and electroplated using megasonic radiation at 200 W power, 2 milliseconds pulse and 100% duty cycle. The megasonic activation (ON) time used for the wafers was 0, 2, 5, 10 and 60 seconds, respectively. The wafers were examined for defects. FIG. 28 contains a bar chart showing defect counts associated with each activation time. As expected, the wafer for which the ON time was zero seconds had the highest number of defects, approximately 550 defects. As megasonic activation time increased between the wafers, the number of defects decreased significantly, especially during the first 10 seconds after a leading edge pierced the liquid bath surface.

Figure 29:
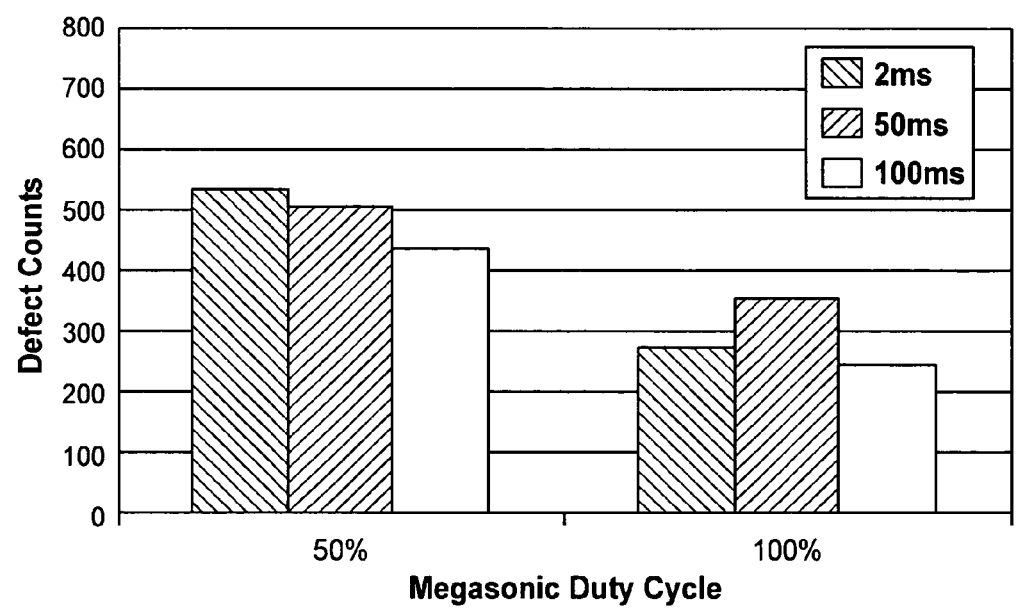
FIG. 29 contains a chart showing defect counts on wafers processed using different duty cycles and pulse lengths.

Six wafers of a second set of wafers were immersed and electroplated at 200 W power and five seconds activation time, but with different pulse lengths and duty cycles. A group of three wafers were processed at 50% duty cycle, and a group of three wafers were processed at 100% duty cycle. In each group, the three wafers were processed using megasonic radiation at 2 ms, 50 ms and 100 ms pulse length, respectively. FIG. 29 contains a bar chart showing defect counts associated with duty cycle and pulse length. The defect count is lower when the duty cycle is 100% instead of 50%. The results suggest that a longer pulse length results in fewer defects than a shorter pulse length.

Methods and systems in accordance with the invention are useful in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the methods and structures described in the claims below and by their equivalents.

The invention claimed is:

1. A method of immersing a semiconductor wafer into a liquid bath, comprising steps of:
    positioning a wafer above a horizontal liquid surface of a liquid bath, said wafer having a planar wafer surface;
    positioning said wafer so that said planar wafer surface is tilted at an angle to a plane parallel to said horizontal liquid surface;
    while said wafer is tilted, moving said wafer downward toward said horizontal liquid surface so that a leading outer edge region of said planar wafer surface pierces said horizontal liquid surface;
    rotating said wafer as said leading outer edge region pierces said horizontal liquid surface; and
    applying sonic radiation in said liquid bath as said leading outer edge region pierces said horizontal liquid surface.

2. A method of immersing a semiconductor wafer as in claim 1 wherein said applying sonic radiation comprises:
    applying sonic radiation directed to a wafer portion of said planar wafer surface as said leading outer edge region pierces said horizontal liquid surface;
    wherein said wafer portion includes at least a part of said leading outer edge region of said planar wafer surface.

3. A method of immersing a semiconductor wafer as in claim 2 wherein said wafer portion is substantially less than the total wafer surface area.

4. A method of immersing a semiconductor wafer as in claim 1 wherein said applying sonic radiation comprises:
    applying sonic radiation directed to a wafer portion of said planar wafer surface;
    wherein said wafer portion includes at least a part of said leading outer edge region of said planar wafer surface.

5. A method of immersing a semiconductor wafer as in claim 4 wherein said wafer portion is substantially less than the total wafer surface area.

6. A method of immersing a semiconductor wafer as in claim 1 wherein said applying sonic radiation to a wafer portion comprises:
    applying sonic radiation using a sonic transducer having a substantially planar radiating surface.

7. A method of immersing a semiconductor wafer as in claim 6 wherein:
    said substantially planar radiating surface is located in said liquid bath below said horizontal liquid surface and said substantially planar radiating surface is disposed substantially parallel to said horizontal liquid surface.

8. A method of immersing a semiconductor wafer as in claim 7 wherein:
    said radiating surface is located at a distance in a range of about from 10 millimeters (mm) to 30 mm below said horizontal liquid surface.

9. A method of immersing a semiconductor wafer as in claim 6 wherein said applying sonic radiation to a wafer portion comprises:
    applying sonic radiation directed substantially normal (perpendicular) to said wafer portion of said planar wafer surface.

10. A method of immersing a semiconductor wafer as in claim 1 wherein:
    said radiating surface has a footprint area on said wafer not exceeding one-third of the total surface area of said wafer.

11. A method of immersing a semiconductor wafer as in claim 10 wherein:
    said radiating surface has a footprint area on said wafer having an arc angle not exceeding 90°.

12. A method of immersing a semiconductor wafer as in claim 10 wherein:
    said radiating surface has a footprint area on said wafer having an arc angle not exceeding 45°.

13. A method of immersing a semiconductor wafer as in claim 10 wherein:
    said radiating surface has a footprint area on said wafer having an arc angle not exceeding 30°.

14. A method of immersing a semiconductor wafer as in claim 13 wherein:

said footprint area of said radiating surface does not exceed one-twelfth of the total wafer surface area.

15. A method of immersing a semiconductor wafer as in claim 10 wherein:
not less than about one-third of said footprint area of said radiating surface on said wafer is located within a radial distance on said wafer between the exposed edge of said wafer and 0.8R (radius) from the wafer center.

16. A method of immersing a semiconductor wafer as in claim 10 wherein:
not less than about two-thirds of said footprint area of said radiating surface on said wafer is located within a radial distance on said wafer between the exposed edge of said wafer and 0.8R (radius) from the wafer center.

17. A method of immersing a semiconductor wafer as in claim 1 wherein:
said sonic radiation consists substantially of megasonic radiation having a frequency not less than about 800 kHz.

18. A method of immersing a semiconductor wafer as in claim 1 wherein said applying sonic radiation to a wafer portion comprises:
applying sonic radiation using a transducer power density corresponding to a range of about from 0.05 Watts per squared centimeter ($W/cm^2$) to 3.0 $W/cm^2$ of total wafer surface area.

19. A method of immersing a semiconductor wafer as in claim 1 wherein said applying sonic radiation comprises:
generating substantially no cavitation in said liquid bath.

20. A method of immersing a semiconductor wafer as in claim 1, further comprising:
removing dissolved gas from said liquid bath using at least a partial vacuum before said applying sonic radiation.

21. A method of immersing a semiconductor wafer as in claim 1 wherein:
said applying sonic radiation comprises applying sonic radiation directed to a wafer portion of said planar wafer surface as said leading outer edge region pierces said horizontal liquid surface, wherein said wafer portion is substantially less than the total wafer surface area and said wafer portion includes at least a part of said leading outer edge region of said planar wafer surface;
said radiating surface has a footprint area on said wafer having an arc angle not exceeding 45°;
said radiating surface is located at a distance in a range of about from 10 millimeters (mm) to 30 mm below said horizontal liquid surface;
said footprint area of said radiating surface does not exceed one-eighth of the total surface area of said wafer; and
said applying sonic radiation to a wafer portion comprises applying sonic radiation using a transducer power density corresponding to not less than 0.14 $W/cm^2$ of total wafer surface area.

22. A method of immersing a semiconductor wafer as in claim 21 wherein:
said applying sonic radiation to said wafer portion comprises applying sonic radiation using a transducer power density corresponding to not more than 0.8 $W/cm^2$ of total wafer surface area.

23. A method of immersing a semiconductor wafer as in claim 21, further comprising:
moving said wafer to a wafer treatment position, wherein said wafer portion in said wafer treatment position is located at a distance in a range of about from 3 mm to 8 mm above said radiating surface of said sonic transducer; and
electroplating copper on said wafer in said wafer treatment position.

24. A method of immersing a semiconductor wafer into a liquid bath, comprising steps of:
positioning a wafer above a horizontal liquid surface of a liquid bath, said wafer having a planar wafer surface;
positioning said wafer so that said planar wafer surface is tilted at an angle to a plane parallel to said horizontal liquid surface;
while said wafer is tilted, moving said wafer downward toward said horizontal liquid surface so that a leading outer edge region of said planar wafer surface pierces said horizontal liquid surface; and
applying sonic radiation in said liquid bath;
wherein said applying sonic radiation comprises applying sonic radiation directed to a wafer portion of said planar wafer surface as said leading outer edge region pierces said horizontal liquid surface, wherein said wafer portion is substantially less than the total wafer surface area and said wafer portion includes at least a part of said leading outer edge region of said planar wafer surface.

25. A liquid treatment system operable to apply sonic radiation to avoid bubble formation on a surface of an integrated circuit wafer, comprising:
a liquid treatment chamber for holding a liquid bath;
a wafer holder, said wafer holder being operable to position a wafer above a liquid bath, to rotate said wafer, to tilt said wafer at a non-horizontal angle, and to immerse a tilted wafer into said liquid bath; and
a sonic transducer having a radiating surface located in said liquid treatment chamber, said sonic transducer being operable to direct sonic radiation through a liquid bath to a wafer portion of a tilted planar wafer surface being immersed into said liquid bath;
wherein said tilted planar wafer surface has a leading outer edge region, said wafer portion is substantially less than the total wafer surface area, and said wafer portion includes at least a part of said leading outer edge region of said tilted planar wafer surface.

\* \* \* \* \*